(12) United States Patent
Degenhardt et al.

(10) Patent No.: US 8,203,119 B2
(45) Date of Patent: Jun. 19, 2012

(54) CHARGED PARTICLE BEAM DEVICE WITH RETARDING FIELD ANALYZER

(75) Inventors: Ralf Degenhardt, Landsham (DE); Hans-Peter Feuerbaum, Munich (DE); Dirk Hambach, Munich (DE); Walter Kögler, Munich (DE); Harry Munack, Munich (DE); Carlo Salvesen, Munich (DE)

(73) Assignee: ICT Integrated Circuit Testing Gesellschaft fur Halbleiterpruftechnik mbH (DE)

( * ) Notice: Subject to any disclaimer, the term of this patent is extended or adjusted under 35 U.S.C. 154(b) by 921 days.

(21) Appl. No.: 11/568,442

(22) PCT Filed: Jun. 10, 2005
(Under 37 CFR 1.47)

(86) PCT No.: PCT/EP2005/006247
§ 371 (c)(1),
(2), (4) Date: Feb. 3, 2009

(87) PCT Pub. No.: WO2005/122208
PCT Pub. Date: Dec. 22, 2005

(65) Prior Publication Data
US 2009/0200463 A1  Aug. 13, 2009

(30) Foreign Application Priority Data

Jun. 11, 2004 (EP) .................................... 04013786

(51) Int. Cl.
*G01N 23/00* (2006.01)
*G21K 7/00* (2006.01)
(52) U.S. Cl. ........ 250/307; 250/306; 250/305; 250/310; 250/311; 250/296; 250/396 R; 250/396 ML
(58) Field of Classification Search .......... 250/305–307, 250/310, 311, 296, 396 R, 396 ML
See application file for complete search history.

(56) References Cited

U.S. PATENT DOCUMENTS 3,582,649 A * 6/1971 Taylor ........................... 250/305
(Continued)

FOREIGN PATENT DOCUMENTS

DE  3138990  4/1983
(Continued)

OTHER PUBLICATIONS

International Search Report and Written Opinion for International Application No. PCT/EP2005/006247, dated Feb. 24, 2006.
(Continued)

*Primary Examiner* — Jack Berman
*Assistant Examiner* — Meenakshi Sahu
(74) *Attorney, Agent, or Firm* — Patterson & Sheridan, LLP

(57) ABSTRACT

The invention provides a charged particle beam device to inspect or structure a specimen with a primary charged particle beam propagating along an optical axis; a beam tube element having a tube voltage; and a retarding field analyzer in the vicinity of the beam tube element to detect secondary charged particles generated by the primary charged particle beam on the specimen. According to the invention, the retarding field analyzer thereby comprises an entrance grid electrode at a second voltage; at least one filter grid electrode at a first voltage; a charged particle detector to detect the secondary charged particles; and at least one further electrode element arranged between the entrance grid electrode and the at least one filter grid electrode. The at least one further electrode element reduces the size of the stray fields regions in the retarding electric field region to improve the energy resolution of the retarding field analyzer. The improvement of the energy resolution is significant, in particular when the beam tube element is part of a high voltage beam tube.

43 Claims, 23 Drawing Sheets

U.S. PATENT DOCUMENTS

| | | | |
|---|---|---|---|
| 3,681,600 A * | 8/1972 | Rigden et al. | 250/305 |
| 3,805,068 A | 4/1974 | Lee | |
| 4,179,604 A | 12/1979 | Christou | |
| 4,442,355 A | 4/1984 | Tamura et al. | |
| 4,540,885 A | 9/1985 | Plies et al. | |
| 4,546,254 A | 10/1985 | Yamauchi | |
| 4,714,831 A | 12/1987 | Clark et al. | |
| 5,486,697 A | 1/1996 | Stalder et al. | |
| 6,545,277 B1 * | 4/2003 | Kella et al. | 250/310 |
| 2002/0011565 A1 | 1/2002 | Drexel et al. | |

FOREIGN PATENT DOCUMENTS

| | | |
|---|---|---|
| EP | 0 147 676 | 10/1985 |
| EP | 0 262 365 | 4/1988 |
| EP | 0 263 942 | 4/1988 |
| EP | 0 843 335 | 5/1998 |
| EP | 0 918 350 | 5/1999 |
| EP | 1 271 603 | 1/2003 |
| GB | 1370360 | 10/1974 |
| JP | 10188883 | 7/1988 |
| JP | 01117260 | 5/1989 |
| JP | 05266854 | 10/1993 |
| JP | 05273154 | 10/1993 |
| JP | 08329872 | 12/1996 |
| JP | 2001357808 | 12/2001 |

OTHER PUBLICATIONS

Frosien, et al. "High precision electron optical system for absolute and CD-measurements on large substrates," Nuclear Instruments & Methods in Physics Research, Section—A: Accelerators, Spectrometers, Detectors and Associated Equipment, North Holland Publishing Company, Amsterdam, NL, vol. A363, No. 1, 1995, pp. 25-30, XP004009617.

PCT International Preliminary Report on Patentability and Written Opinion for International Application No. PCT/EP2005/006247, dated Dec. 28, 2006.

European Search Report for European Application No. 04013786.1, dated Nov. 11, 2006.

Excerpt of Larousse Dictionary of Science and Technology, 1995, Larousse, United Kingdom, Prof. Peter M. B. Walker (ED.), pp. 574-575.

EP Office Action dated Sep. 10, 2007 for European Application No. 04 013 786.1.

"Murflor/Muflor + carbon/Muflor + bronze – Technical data", [Online] Murtfeld Kunststoffe GMPH, Retrieved from the Internet: URL:http://web.archive.org/web/20040127191526/http://www.murtfeldt.de/en/werkstoffe/direktwahl/murflor_murflor_kohle_murflor_bronze/technische_daten/>.

Idris, et al. "Film characteristics of low-temperature plasma enhanced chemical vapor deposition silicon dioxide using tetraisocyanatesilane and oxygen," Jpn. J. Appl. Phys., vol. 37, 1998, pp. 6562-6568.

Huchital, et al. "Resolution and sensitivity of the spherical-grid retarding potential analyzer," J. Appl. Phys., vol. 43, No. 5, May 1972, pp. 2291-2302.

Palmberg "Optimization of auger electron spectroscopy in LEED systems," Applied Physics Letters, vol. 13, No. 5, 1968, pp. 183-185.

* cited by examiner

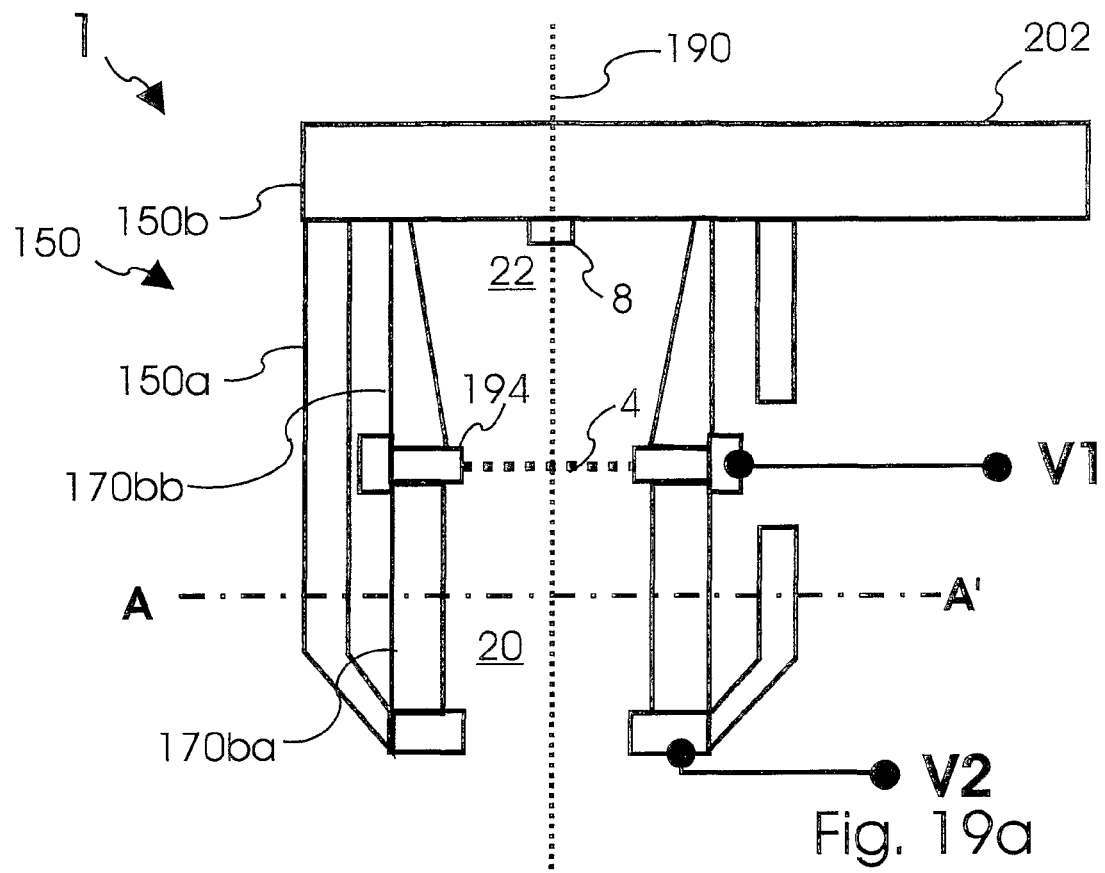
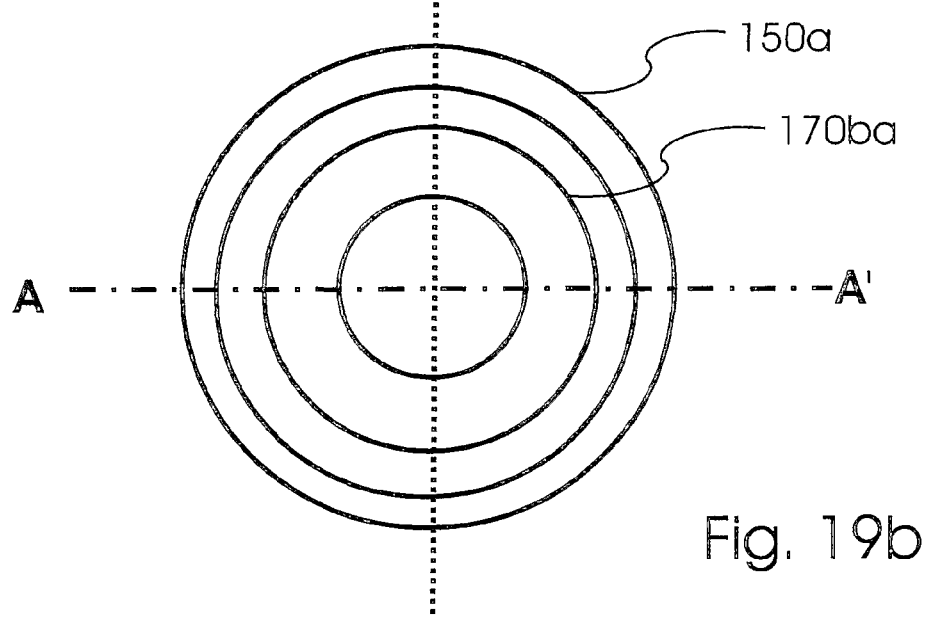
Fig. 19a
Fig. 19b

CHARGED PARTICLE BEAM DEVICE WITH RETARDING FIELD ANALYZER

BACKGROUND OF THE INVENTION

1. Field of the Invention

The invention relates to a charged particle beam device using a retarding field analyzer to inspect specimens with a primary charged particle beam. The invention also relates to a retarding field analyzer that can be used in devices like a charged particle beam device.

2. Description of the Related Art

Retarding field analyzers in charged particle beam devices are frequently used to analyze the energy distributions of secondary charged particles that are generated by a primary charged particle beam on a specimen. Since the energy distributions of the secondary charged particles carry information about the electrical potential and material of the specimen in the region where the primary charged particle beam interacts with the specimen, a scanning charged particle beam device with a retarding field analyzer can be used to generate a map with voltage or material distributions on the surface of the specimen. Such measurements are usually referred to as voltage- or material contrast measurements.

Voltage and material contrast measurements of specimens by means of charged particle beams have evolved into a highly sophisticated technique. For example, the review article of E. Menzel and E. Kubalek "Fundamentals of Electron Beam Testing of Integrated Circuits", in SCANNING Vol. 5, 103-122 (1983) describes the use of retarding field analyzers in scanning electron microscopes to measure voltage- and material contrast of integrated circuits with a spatial resolution in the sub-micron range. More recent descriptions on voltage contrast measurements are given in the article "Electrical testing for failure analysis: E-beam Testing" by Michel Vallet et al. in Microelectronic Engineering 49 (1999) p. 157-167, and in "Microanalysis Using Secondary Electrons in Scanning Electron Microscopy" by S. Mil'shtein et al. in Scanning vol. 23, p. 295-297 (2001).

Retarding field analyzers are used to discriminate charged particles according to their kinetic energy with high energy resolution. This is achieved by providing a well-defined electrical potential barrier which rejects charged particles with an energy too low to overcome the potential barrier. Charged particles that have a sufficient energy, however, overcome the potential barrier and are detected by a charged particle detector.

The discrimination of charged particles according to their energy by means of a retarding field analyzer is usually used to reconstruct an energy distribution of the incoming charged particles. An energy distribution of the incoming electrons with the retarding field analyzer is obtained by measuring the detection rates for a set of predetermined electrical potential barriers of various potential energies. If an energy distribution measurement with a high energy resolution is required, the energy intervals between the various electrical potential barriers need to be small. This in turn requires the electrical potential barriers to be well defined.

FIG. 1a and FIG. 1b illustrate the working principle of a planar retarding field analyzer 1 for analyzing the energy distribution of incoming electrons 2. The retarding field analyzer 1 comprises an entrance grid electrode 10 at a second voltage V2 at Z-position P1, a filter grid electrode 4 at a first voltage V1 at Z-position P2 and an electron detector 8 at a detector voltage VS at Z-position P3. The region between the entrance grid electrode 10 and the filter grid electrode 4 is referred to as the retarding electric field region 20. The first voltage V1 is more negative than the second voltage V2 in order to provide a retarding electric field 6 within the retarding electric field region 20 that decelerates incoming electrons 2 that have passed through the entrance grid electrode 10. In the addition, entrance grid electrode 10 and the filter grid electrode 4 are coplanar to each other in order to provide equipotential lines 14 coplanar to the entrance grid electrode 10. With the parallel equipotential lines 14, incoming electrons that enter the retarding field region 20 at a vertical entrance angle 30 with respect to the entrance grid electrode 10, do not experience a lateral force by the retarding electric field 6 and therefore do not change direction.

Incoming electrons 2b that have an energy higher than the potential barrier height 28 (see FIG. 1b), which is given by Ep=e(V2−V1), and enter the retarding field region 20 at a vertical entrance angle 30, overcome the electric potential barrier 26 and pass through the filter grid electrode 4 to enter the accelerating electric field region 22 with the accelerating electric field 12. Incoming electrons 2a with energy too low to summount the potential barrier height 28 do not enter the retarding field region 20. The accelerating electric field 12 serves to accelerate the electrons in order to increase the detection efficiency of the electron detector 8. The electron detector 8 in turn converts the electron signal into a current J which is measured by the current measurement device 24.

It is important for a precise voltage and material contrast measurement that the retarding field analyzer discriminates the incoming electrons according to the same energy and independent of the position of where the electrons 2 enter the retarding field analyzer. To achieve this, it is important that the electrons 2 do not experience lateral forces in the retarding electric field region 20. This implies that the equipotential lines 14 in the retarding electric field region 20 are coplanar to the entrance grid electrode 10 and the filter grid electrode 4, which in turn implies that the entrance grid electrode 10 and the filter grid electrode 4 should be as coplanar as possible to each other.

FIG. 2a and FIG. 2b illustrate the working principle of a spherical retarding field analyzer 50 analyzing the energy distributions of incoming electrons 2. Its operation is like the one of a planar retarding field analyzer 1. However, for the spherical retarding electric field 50, the spherical entrance grid electrode 10 and the spherical filter grid electrode 4 are concentrically arranged to each other in order to provide a retarding electric field region 20 with equipotential lines 14 that run concentrically to the entrance grid electrode 10. Ideally, the concentrically arranged equipotential lines 14 make sure that incoming electrons 2 that enter the entrance grid electrode 10 at a vertical entrance angle 30 do not experience a lateral force due to the retarding electric field 6. Instead, like in FIGS. 1a and 1b, they should be decelerated without changing direction. Provided that there is a vertical entrance angle 30 and no deflection in the openings of the entrance grid electrode 10, the incoming electrons 2 experience the same energy cut, given by Ep=(V2−V1), which is independent of the position where they enter the retarding electric field region 20. Spherical retarding field analyzers are usually employed when the incoming secondary charged particles approach the entrance grid electrode 10 not in parallel but in diverging directions with a significant divergence angle.

However, problems arise when the entrance grid electrode and the filter grid electrode are not coplanar or not concentric. In this case, the equipotential lines 14 are not homogeneously distributed but distorted. The same is true for regions at the edges of the entrance grid electrode and the filter grid electrode. Regions with distorted equipotential lines are called stray field regions.

Incoming electrons which enter a retarding electric field region within the stray field region experience a lateral field force and change direction. Further, electrons that have changed direction need a higher energy to overcome a given potential barrier than electrons that enter the retarding electric field region in a coplanar field region in the direction of the electric field. In other words, the potential barrier height 28 depends on the position at which the electrons pass through the entrance grid electrode 10. As a consequence, the potential barrier height 28 is blurred as indicated in FIG. 3 by the two potential barriers 28c, effective for electrons entering the retarding electric field in the coplanar field region, and potential barriers 28d, effective for electrons entering the retarding electric field in a stray field region. A blurred potential barrier height diminishes the ability of the retarding field analyzer to distinguish between different energy distributions.

In recent years, low energy (e.g. 100 eV to 2000 eV) electron beam microscopes have been developed for the inspection of specimens with high spatial resolution (smaller than 10 nm) and high throughput. Such a device is described for example in the publication of J. Frosien, S. Lanio, H. P. Feuerbaum in "High precision electron optical system for absolute CD-measurements on large substrates" in: Nuclear Instruments and Methods in Physics Research A 363 (1995) 25-30. High spatial resolution at high throughput is achieved e.g. by using a combined electrostatic magnetic objective lens, a high voltage beam tube and in-lens detectors, all three of which are shown in FIG. 4.

FIG. 4 schematically illustrates an electron beam microscope 100 with a combined electrostatic magnetic objective lens 123, a high voltage beam tube 107 and an in-lens detector 114. The primary electron beam 104 that probes the specimen 102 is generated at the electron beam source 106 with a voltage $V_{cath}$ and is focused with focusing units 120. The primary electron beam 104 is accelerated by means of the beam anode 101 having an anode voltage $V_{anode}$. For this type of microscope, the anode voltage $V_{anode}$ is also applied to the high voltage beam tube 107 which guides the primary electron beam 104 at a high energy to the combined electrostatic magnetic objective lens 123. The combined electrostatic magnetic objective lens 123 is comprised of the magnetic objective lens activated by the magnetic coil 121 and the electrostatic objective lens comprised of the electrostatic electrodes 110, 112 of the beam column 109 and of the high voltage beam tube 107, respectively. The combined electrostatic magnetic objective lens 123 decelerates the primary electron beam 104 and focuses it onto the specimen 102 at the focus position 126. The field of the electrostatic objective lens can be adjusted by changing the voltage of electrode 110 independently of beam column 109.

The high voltage beam tube 107 serves to guide the primary electron beam 104 at a high energy close towards the specimen 102 before the primary electrons are decelerated by electrostatic objective lens 110, 112 and the potential Vsp of specimen 102. The high voltage of the high voltage beam tube, which typically is in the range of 2,000V to 10,000 V, reduces beam spread during the electron transport from the electron beam source 106 to the specimen 102 and allows for higher beam currents. The high voltage beam tube 107 therefore facilitates the operation at high current beams and high spatial resolution for low electron energy beam inspection of the specimen 102.

The electron beam microscope 100 of FIG. 4 is further characterized by its in-lens detector design. In-lens detector design refers to the fact that detector 114 and objective lens 123 are designed in a way that the detector 114 detects secondary charged particles 105 that pass through the aperture of the combined electrostatic magnetic objective lens 123. This allows for the detection of secondary charged particles 105 that leave the specimen 102 in a direction close to the opposite direction of the primary electron beam 104. Further, the secondary particles 105 that arrive at the in-lens detector 114 have been accelerated to a high energy due to the high voltage of the high voltage beam tube 107.

Not shown in FIG. 4 is the "crossover region" of the beam of secondary charged particles 105. The crossover region is an area where the emitted secondary charged particles 105 form a crossover due to the electric and magnetic fields of the combined electrostatic magnetic optical lens 126. The position and shape of the crossover also determine the direction of the secondary charged particles after their passage through the crossover region.

The detector 114 in FIG. 4 typically comprises a scintillator to convert the electron signal into light and a light guide to transport the light to a photomultiplier. The photomultiplier in turn delivers the signal to an electronic device that registers the signal for evaluation.

For many applications, in particular for measuring voltage and/or material contrast of specimens, it would be advantageous to provide a charged particle beam device with a retarding field analyzer with high energy resolution, large acceptance and precise voltage and/or material contrast sensitivity. However, high energy resolution requires a retarding field analyzer with a small ratio of the sizes of the stray field region 41 compared to the size of the coplanar (or concentric) field region 40. However, providing a small stray field region ratio is difficult to achieve if the space for the retarding electric field region within the charged particle beam device is small.

It would be further advantageous to place the retarding field analyzer near the primary charged particle beam in order to detect secondary charged particles that are emitted from the specimen in a direction opposite to the primary charged particle beam. This implies that the retarding field analyzer is placed near or within the high voltage beam tube. However, it is difficult to design a retarding field analyzer with a small stray field region if the retarding field analyzer is placed near or within the high voltage beam tube, since the high voltage intrudes into the retarding electric field and increases the stray field region.

Vice versa, the electric fields of the retarding field analyzer will also disturb the primary charged particle beam in regions where the charged particle beam is not shielded. The larger the potential difference between the high voltage beam tube and the filter grid electrode, the larger the disturbance on the charged particle beam. Therefore, it would further be advantageous to provide a retarding field analyzer that does not influence the primary charged particle beam.

Further, the retarding field analyzer of a charged particle beam device with a high-voltage beam column and in-lens detector design detects secondary charged particles which are accelerated to high energies. On the other hand, the energy range for voltage or material contrast measurements is only a few volts and for some applications, a voltage resolution of less than 10 mV is required. Therefore, it represents a considerable problem for the retarding field analyzer to discriminate secondary charged particles within an energy range of a few eV or less while the mean energy of the secondary charged particles is in the range of several keV.

It is therefore an object of the present invention to provide a retarding field analyzer that overcomes the problems mentioned above.

It is further an object of the present invention to provide a charged particle beam device that can be operated with a retarding field analyzer in the vicinity of the primary charged particle beam without disturbing the primary charged particle beam.

It is further an object of the present invention to provide a retarding field analyzer that can be operated with high energy resolution even when located in the vicinity of a beam tube element of a charged particle beam device.

SUMMARY OF THE INVENTION

This and other aspects of the present invention are solved by providing charged particle beam devices. According to another aspect of the present invention, improved retarding field analyzers are provided. According to another aspect of the present invention, an improved method of inspecting a specimen is provided. Further details, modifications and aspects of the present invention are described in the independent claims, the description and the figures below in this application.

The charged particle beam device according to the invention is capable of inspecting a specimen with high spatial resolution and high throughput by means of an energy dependent detection of secondary charged particles. The at least one further electrode element, the at least one ring electrode and/or the at least one high-ohmic electrode make it possible to electrically shield the secondary charged particles from the beam tube element. Further, they can be used to reduce the size of stray field regions within the retarding electric field region, which improves the energy resolution for the detection of the secondary charged particles. A high energy resolution is important for voltage or material contrast measurements on a specimen, where an energy resolution of the secondary charged particles within the eV range and better is needed.

With charged particle beam devices according to the invention, it is possible to place the retarding field analyzer in the vicinity of the primary charged particle beam without compromising the energy resolution of the retarding field analyzer. Having the retarding field analyzer in the vicinity of the primary charged particle beam allows the retarding field analyzer to be designed as an in-lens detector. The in-lens detector design for charged particle beam devices is known for its compact design and high detection efficiency for secondary charged particles.

Further, the at least one further electrode element, the at least one ring electrode and/or the at least one high-ohmic electrode can be used to provide sufficient coplanarity or concentricity of the equipotential lines of the retarding electric field region, even when the beam tube element near the retarding field analyzer is at a high voltage with respect to the specimen. The compatibility of a high quality retarding field analyzer with a high voltage beam tube element nearby makes it possible to combine a retarding field analyzer with the high throughput of a charged particle beam device with a high voltage beam tube.

Preferably, the charged particle beam devices according to the invention include an entrance grid electrode which is connectable to a second voltage V2. This way, by placing the entrance grid electrode coplanar or concentric with respect to the filter grid electrode, it is possible to provide for a retarding electric field region for decelerating the secondary charged particles that is particularly homogeneous. Preferably, the entrance grid electrode comprises multiple openings for enabling the secondary charged particles to enter the retarding electric field region.

Preferably, the at least one further electrode element, the at least one ring electrode and/or the at least one high-ohmic electrode surround the beam tube element in order to shield the retarding electric field region from the potential of the beam tube element. Preferably, the at least one further electrode element, the at least one ring electrode and/or the at least one high-ohmic electrode form a cylindrical structure surrounding the beam tube element. Preferably, the diameter of the cylindrical structure is larger than the diameter of the beam tube element and smaller than the diameter of the entrance grid electrode and/or the filter grid electrode surrounding the beam tube element. The smaller the diameter of the surrounding further electrode element, the more space is left for the coplanar field region of the retarding field analyzer.

Preferably, the at least one further electrode element and/or the at least one ring electrode are made of material with an electric resistivity smaller than $10^{13}$ Ωcm and preferably smaller than $10^{11}$ Ωcm. The at least one further electrode element and/or the at least one ring electrode further are preferably electrically connected to a voltage source. The voltage source is used to ensure that the further electrode element and/or the at least one ring electrode are at a defined voltage. The voltage source may be the voltage source of the filter grid electrode, the voltage source of the entrance grid electrode and/or an external voltage source.

In one preferred embodiment, the at least one further electrode element is a high high-ohmic electrode. Preferably, the high-ohmic electrode comprises high-ohmic material with a resistivity between $10^7$ Ωcm and $10^{13}$ Ωcm and, even more preferred, between $10^9$ Ωcm to $10^{11}$ Ωcm. In this embodiment, the high-ohmic electrode is preferably electrically connecting the filter grid electrode with the entrance grid electrode. By applying a second voltage V2 to the entrance grid electrode and a first voltage V1 to the filter grid electrode, a current between the filter grid electrode and the entrance grid electrode is generated which provides a continuously decreasing or increasing potential on the surface of the high-ohmic electrode. Continuously decreasing or increasing potential boundaries can help to reduce distortions of the equipotential lines within the retarding electric field region, i.e. reduce the stray field region.

The resistivity of the high-ohmic material is preferably chosen according to the actual shape and structure of the further electrode element, since the structure together with the resistivity define the total resistance between filter grid electrode and entrance grid electrode. The preferred total resistance in turn is chosen on the one hand to keep the current between further electrode elements and entrance grid electrode low while, on the other hand, to maintain sufficient conductivity to avoid charge-up of the further electrode element due to secondary charged particles striking the surface of the electrode element. A preferred high-ohmic material could be Murflor, a mixed ceramic based on tin oxide, zirconium oxide, aluminum oxide or aluminum nitride/titanium nitride, or an epoxy resin with ZELEC™.

Preferably, the at least one high-ohmic electrode surrounds the retarding electric field region essentially concentrically with respect to the beam tube element. Preferably, the at least one high-ohmic electrode has a cylindrical or conical shape surrounding the retarding electric field region.

Preferably, resistance of the material of the high-ohmic electrode is high enough that during normal operation of the retarding field analyzer, the current flowing through the high-ohmic electrode from the entrance grid electrode to the filter grid electrode or vice versa is small enough to not change the stability of the materials involved. Preferably, the currents flowing from the entrance grid electrode to the filter grid electrode are smaller than 1 µA.

In another preferred embodiment, the at least one further electrode element is made of low-ohmic material, preferably a metal or any other material with a resistivity lower than 10 $\Omega$cm and preferably smaller than $10^{-1}$ $\Omega$cm. In this case the voltage distribution across the corresponding electrode element is essentially constant. Preferably, the voltage of the low-ohmic further electrode element is adjustable by an external voltage source. This way the voltage can be optimized to minimize the stray field regions within the retarding electric field region.

In yet another preferred embodiment, the at least one further electrode element comprises at least one high-ohmic electrode and at least one element made of low-ohmic material. Preferably, the high-ohmic electrode electrically connects the entrance grid electrode with the filter grid electrode, while the low-ohmic material element preferably is adjustable by an external voltage source. This way, the advantages of each of the two types of electrodes can be combined.

The charged particle beam device according to the invention can be any device that uses a primary charged particle beam to inspect or structure a specimen. Preferably, the primary charged particles are positively or negatively charged ions or, even more preferred, electrons. Charged particle beam devices with electron beams, i.e. electron beam devices like e.g. electron beam microscopes or electron beam pattern generators, are preferred.

Preferably, the specimens that are to be inspected or structured are microprocessed semiconductor devices like wafers or chips with integrated circuits or micromechanical devices. However, any other object that is to be inspected or structured with a spatial resolution in the sub-micron range can be used as a specimen for the charged particle beam device according to the invention.

The primary charged particle beam source generates and forms the primary charged particle beam. The primary charged particle beam source can be any device that is able to deliver charged particles into vacuum. For electrons, the primary charged particle beam source can be e.g. a thermionic electron source or a field emission electron source, depending on the kind of application. After emission of the charged particles into vacuum, the primary charged particle beam is formed to be directed towards the specimen along an optical axis. The optical axis of the charged particle beam device is preferably determined by charged particle beam optical components that form, direct and focus the primary charged particle beam.

The charged particle beam device is provided with a beam tube element having a tube voltage VT. Preferably, the primary charged particle beam passes through the beam tube element. Preferably, the beam tube element is essentially coaxial to the optical axis. The beam tube element serves to shield the primary charged particle beam from electric fields. Preferably, the beam tube element is an element of a beam column. In an even more preferred embodiment, the beam tube element is an element of a high voltage beam tube to shield the primary charged particle beam against the electric fields of the retarding field analyzer. Preferably, the beam tube element is arranged in the region between the entrance grid electrode and the charged particle detector.

In order to electrostatically shield the primary charged particle beam, the beam tube element is at a fixed tube voltage VT. Preferably, the beam tube element is made of a metal or any other non-magnetic conducting material in order to not influence the primary charged particles.

The retarding field analyzer is positioned in the vicinity of the beam tube element. "In the vicinity" refers to the shortest distance between the retarding electric field region and the beam tube element. Preferably, the shortest distance is smaller than a hundred times, preferably smaller than ten times and even more preferred smaller than one time the diameter of the inner cross section of the beam tube element at the position where the shortest distance is measured.

The secondary charged particles are charged particles which are generated by the primary charged particle beam on the specimen. If the primary charged particles are electrons, the secondary charged particles are usually electrons as well. If those electrons have energies smaller than 50 eV, they are classified, by definition, as "secondary electrons". If those electrons have energies larger than 50 eV, they are classified, by definition, as "backscattered electrons".

The retarding field analyzer according to the invention comprises an entrance grid electrode at a second voltage V2, a filter grid electrode at a first voltage V1 and a charged particle detector. Entrance grid electrode and filter grid electrode serve to provide a retarding electric field between entrance grid electrode and filter grid electrode. Second voltage V2 and first voltage V1 are preferably such that the retarding electric field exerts a decelerating force on secondary charged particles that have passed through the entrance grid electrode.

In order to have the secondary charged particles pass through the entrance grid electrode or filter grid electrode, both have to transmit the secondary charged particles. In order to serve as the electrode for the retarding electric field and as the entrance window for the incoming secondary charged particles, the entrance grid electrode and/or the filter grid electrode preferably are grids with arrays of openings. Preferably, the transparency of a grid is given by the ratio of the sum of the areas of the openings to the total area of the grid. Preferably, the transparency of the entrance grid electrode and/or the filter grid electrode for the incoming charge particles is higher than 60% and even more preferred higher than 90%. The higher the transparency, the higher the detection rate and the faster the measurements of the retarding field analyzer.

Preferably, the filter grid electrode comprises an array of openings with a pitch smaller than 100 µm and preferably smaller than 30 µm. Further, the entrance grid electrode preferably comprises an array of openings with a pitch smaller than 500 µm and preferably smaller than 100 µm. The smaller the pitch is between the openings, the smaller are the fringe field regions of the corresponding grid. Small fringe field regions reduce deflections of the incoming charged particles when they pass through the entrance grid electrode and/or filter grid electrode, which improves the energy resolution.

Preferably, the entrance grid electrode and/or the filter grid electrode are made of microstructures, having openings with diameters smaller than 1 mm, preferably smaller than 100 µm and even more preferred smaller than 10 µm. In a preferred embodiment of the invention, the entrance grid electrode and/or the filter grid electrode are made of silicon that has been micro-machined.

In certain applications, due to space restrictions, the distance between entrance grid electrode and filter grid electrode may be smaller than 100 mm, more preferred smaller than 20 mm and even more preferred smaller than 5 mm. This is to fit the retarding field analyzer within the limited space of a charged particle beam device close to the beam tube element. However, this also limits the performance of the retarding field analyzer.

The charged particle detector detects the secondary charged particles. Preferably, the charged particle detector detects the secondary charged particles after they have passed the filter grid electrode. In one preferred embodiment, the charged particle detector registers the secondary charged particles that impinge on the charged particle detector. Preferably, the charged particle detector detects all secondary charged particles that have passed through the filter grid electrode.

The at least one further electrode element is arranged between the entrance grid electrode and the filter grid electrode to improve the quality of the retarding electric field of the retarding field analyzer. In particular it is meant to reduce the size of the stray field region of the retarding field analyzer and to shield the retarding electric field against the electric field generated by the tube voltage VT of the beam tube element. This way, the retarding field analyzer can be placed in the vicinity of the beam tube element without compromising the quality of the energy resolution.

Preferably, the entrance grid electrode, the filter grid electrode, the charged particle and/or the at least one further electrode element are essentially coaxial to the optical axis. In this case, the sensitive area of the retarding field analyzer for the detection of secondary charged particles within a given distance away from the primary charged particle beam can be maximized. This way, the retarding field analyzer can detect the secondary charged particles that are emitted from the specimen with a direction close to the opposite direction of the primary charged particle beam, which are known to be emitted at a high rate.

Preferably, the beam tube element is essentially coaxial with respect to the optical axis. In order for the retarding field analyzer to be placed near the primary charged particle beam, it is preferred that the diameter of the beam tube element in the region of the retarding field analyzer is small, i.e. smaller than 10 mm and preferably smaller than 2 mm. Preferably, the retarding field analyzer is mounted on the beam tube element.

Preferably, the voltage difference between the first voltage V1 and the tube voltage VT is larger than 1000 V, preferably larger than 4000 V and even more preferred larger than 8000 V. In this case, the charged particle beam device can be designed with a high voltage beam tube with the beam tube element being an element of the high voltage beam tube, while keeping the potential of the specimen at ground potential.

In another preferred embodiment, the specimen is provided with a specimen voltage (VSP). The voltage difference between the specimen voltage VSP and the first voltage V1 of the filter grid electrode preferably defines the threshold voltage VTHR of the retarding field analyzer to discriminate secondary charged particles according to their kinetic energies. If the charged particle beam device is operated to analyze secondary electrons (energy smaller than 50 eV), the threshold voltage VTHR is preferably in the range between 0 V and 50 V. If the charged particle beam device is operated to analyze backscattered electrons (energy larger than 50 eV), the threshold voltage VTHR is preferably in the range between 50 V and 1000 V, or larger in order to register Auger electrons. Therefore, the charged particle beam device is preferably operated with the first voltage V1 in the range between 0V and −1000 V with respect to the specimen voltage VSP. Its exact value depends on the application of the charged particle beam device. Further, the charged particle beam device preferably provides means to adjust the specimen voltage VSP.

Preferably, entrance grid electrode and filter grid electrode are, for the planar retarding field analyzer, coplanar or, for the spherical retarding field analyzer, concentric to each other.

Such a design generates equipotential lines in the retarding electric field regions that are coplanar or concentric to each other. Such equipotential lines improve the energy resolution of a retarding field analyzer considerably.

In the case of a planar retarding field analyzer, the entrance grid electrode and the filter grid electrode are preferably coplanar within 10% and preferably within 1%, or even better, relative to the distance between both electrodes. In one preferred embodiment of the invention, entrance grid electrode and filter grid electrode are normally oriented with respect to the direction of the optical axis within 10% and preferably within 1%. Preferably, the entrance grid electrode and filter grid electrode are axially symmetric with respect to the primary charged particle beam. This way, the angular distribution of the incoming secondary charged particles is usually symmetric.

In another preferred embodiment of the invention, the entrance grid electrode and filter grid electrode are tilted by an angle within the range of zero to 25 degrees, preferably within zero to eight degrees, with respect to the direction of the primary charged particle beam. The tilting allows the entrance grid electrode to be oriented in a normal direction with respect to a selected angular group of incoming secondary charged particles. In certain application modes, such tiltings helps to further improve the energy resolution for this selected angular group of secondary charged particles.

In the case of a spherical retarding field analyzer, the entrance grid electrode and the filter grid electrode are concentric with respect to a common midpoint within 10% and preferably within 1% with respect to the average distance between the midpoint and the filter grid electrode. The more concentric the entrance grid electrode and the filter grid electrode are, the higher the energy resolution is for secondary charged particles.

Preferably, the filter grid electrode, the charged particle detector and at least one further electrode element are enclosed by a further beam tube structure comprising the entrance grid electrode. The further beam tube structure is made of conducting material and has the same voltage as the beam tube element. Preferably, the further beam tube structure also comprises the beam tube element. Preferably, the further beam tube structure also comprises at least one further beam tube structure element. The above features help to shield the retarding field to allow for the operation of the retarding field analyzer without interfering with the primary charged particle beam.

Preferably, the at least one further electrode element, the at least one ring electrode and/or the at least one high-ohmic electrode have an annular, cylindrical or conic shape. The symmetry reduces field distortions within the retarding electric field region. In addition, by applying an appropriate third voltage V3 to the at least one further electrode element, the at least one further electrode element helps to reduce the stray field region of the retarding electric field region, which helps to improve the potential barrier blurring of the retarding field analyzer.

In one preferred embodiment, the at least one further electrode element comprises conducting material. Preferably, the conducting material is a metal. In this case, a well-defined third voltage V3 can be applied to each of the at least one further electrode elements. Preferably, the third voltage V3 is adjusted to optimize the energy resolution by minimizing the stray field region. An electrode comprising conducting material, in this application, refers to an electrode which, contrary to a high-ohmic electrode, provides essentially the same voltage on said electrode when an external voltage is applied during normal retarding field analyzer operation.

Preferably, the retarding field analyzer comprises more than one further electrode element. Preferably, the third voltages V3 of the multiple further electrode elements are adjusted to have the voltages of the multiple further electrode elements in a monotonously increasing order in a direction normal to the filter grid electrode. Having more than one further electrode element helps to shield the retarding electric field region against external voltages and to reduce the stray field regions in the retarding electric field region of the retarding field analyzer.

In a preferred embodiment, the at least one further electrode element comprises at least one inner further electrode element having a first radius, and at least one outer further electrode element having a larger second radius. In this case, the region between the inner further electrode elements, the outer further electrode elements, the entrance grid electrode and the filter grid electrode defines the retarding electric field region. If the retarding field analyzer surrounds the beam tube element, the inner further electrode elements reduce a first stray field region of the retarding electric field region adjacent to the beam tube element, while the outer further electrode elements reduce a second stray field region of the retarding electric field region adjacent to the outer boundary of the retarding electric field region. Preferably, inner and outer further electrode elements are essentially coaxial to each other.

Preferably, the charged particle beam device is an electron beam microscope, a scanning electron microscope or an electron beam pattern generator. Such devices deliver primary charged particle beams with a small probe size that is necessary to resolve the voltage or material contrast of the specimen with high spatial resolution. Those devices in combination with the retarding field analyzer allow the inherent high spatial resolution of such devices to be combined with the high energy resolution of an retarding field analyzer.

Preferably, the charged particle beam device comprises a combined electrostatic magnetic objective lens. The combined electrostatic magnetic objective lens provides very high spatial resolution. However, the electrostatic part of the lens may require a high voltage electrode near the primary charged particle beam. Since the retarding field analyzer according to the invention can be operated even with a high voltage beam tube element nearby, it is possible to combine the retarding field analyzer according to the invention with the beam tube element that provides the high voltage for the electrode of the electrostatic lens.

Preferably, the charged particle detector is an in-lens detector. As mentioned before, in-lens detectors are able to detect secondary charged particles at a high rate. An in-lens detector however requires that the retarding field analyzer is placed in the vicinity of the primary charged particle beam to detect the secondary charge particles that have passed through the objective lens. Therefore, it is preferred to combine the retarding field analyzer design according to the invention with in-lens detector design.

Preferably, the retarding field analyzer comprises at least one high-ohmic electrode and at least one further electrode element comprising a conducting material, preferably a metal. Preferably, the at least one high-ohmic electrode is electrically connected with the entrance grid electrode and the filter grid electrode. This way, a current is flowing between the entrance grid electrode and the filter grid electrode which provides a continuous voltage drop on the surface of the high-ohmic electrode, which can be used to reduce the stray field regions within the retarding electric field region. The additional at least one further electrode element made of conducting material serves to further reduce the stray field region by applying an appropriate third voltage V3 to said further electrode element. The combination of a high-ohmic electrode and a conducting further electrode element for a retarding field analyzer combines the advantages of the two types of electrodes for minimizing the stray field region.

The present invention further comprises an improved method to measure a voltage contrast distribution or a material contrast distribution of a specimen. A voltage contrast measurement refers to a measurement of relative voltages distributed over a region of the surface of a specimen. Similarly, a material contrast measurement refers to a measurement identifying the material distributed over a region of a specimen. For each interaction point of the primary charged particle beam with the specimen, the generated secondary charged particles carry the voltage information and/or material information of that interaction point in the form of an energy distribution of the secondary charged particles. Energy distributions of secondary charged particles in turn can be measured with a retarding field analyzer according to the invention by registering the secondary charged particles that have passed the filter grid electrode. Therefore, by scanning a focussed primary charged particle beam across a region of the specimen, a distribution of relative voltages or a distribution of materials on the surface of the specimen can be measured.

A first step of the method according to the invention comprises applying a tube voltage VT to the beam tube element and the entrance grid electrode. The tube voltage VT for the beam tube element serves to provide an almost field free region for the primary charged particles on their way from the charged particle beam device to the specimen. Preferably, the tube voltage VT accelerates the primary charged particles to an energy of more than 1000 eV. A high energy for the primary charged particles reduces spreading of the primary charged particle beam due to Coulomb forces and disturbing electric fields. Preferably, the tube voltage VT is also applied to the entrance grid electrode to make sure that the retarding field does not generate additional stray fields that interfere with the primary charged particle beam. This way, the retarding field analyzer can be arranged in the vicinity of the primary charged particle beam.

A second step of the method according to the invention comprises applying a first voltage V1 to the filter grid electrode which differs by more than 1000V from the tube voltage VT. Preferably, tube voltage VT is larger than +1000 V while the first voltage V1 is less than 0V. This way it is possible to inspect a specimen, which is connected to ground potential, with a primary electron beam that has been accelerated to energies higher than 1000 eV while at the same time, the secondary charged particles are decelerated by the negative first voltage V1. In this case the negative first voltage V1 of the filter grid electrode generates an electric potential barrier that can be used to analyze the energy distribution of the secondary charged particles. Measured energy distributions of the secondary charged particles at several points of interactions in turn allow for a measurement of the voltage contrast distribution or material contrast distribution.

In one preferred method according to the invention, the first voltage V1 is varied in the range below −50 V. In this case, energy distributions of secondary charged particles with energies above 50 eV can be measured. Secondary charged particles above 50 eV are also called "back-scattered electrons". Energy distributions of back-scattered electrons carry information about the material of the specimen. Therefore, a discrimination of secondary charged particles with the first voltage V1 in the range below −50 V can be used for a measurement of material contrast maps.

In another preferred method according to the invention, the first voltage V1 is varied within the range below 0V and above −50 V. In this case, energy distributions of secondary charged particles with energies below 50 eV can be measured. Such energy distributions carry information about the voltage distribution of the specimen. Therefore, discrimination with a first voltage V1 in the range between 0V and −50 V is used for a measurement of voltage contrast maps.

A third step of the method according to the invention comprises generating at least one third voltage V3 for the at least one further electrode element to reduce the size of a stray field region within the retarding electric field region. The third voltage V3 for the at least one further electrode element can be generated externally or e.g. by using a voltage divider which generates third voltages V3 from the tube voltage VT and the first voltage V1. The smaller the stray field region relative to a given size of the retarding electric field region, the larger the effective area of the retarding field analyzer that can be used for the detection of the secondary charged particles with high precision. The best third voltage V3 for each further electrode element is reached when the sizes of the stray field regions are minimized. The best third voltages V3 can be found e.g. by experiment, by calculation or by simulating the electric fields via a computer simulation.

A fourth step of the method according to the invention comprises scanning the primary charged particle beam over a region of the surface of the specimen. Preferably, for each scanning position, an energy distribution of the secondary charged particles is measured to determine a relative voltage and/or material of that position on the surface of the specimen. By scanning the primary charged particles over several scanning positions, a distribution of voltage values and/or materials can be measured.

A fifth step of the method according to the invention comprises detecting the secondary charged particles that have passed through the filter grid electrode. The detected signal is a measure of how many secondary charged particles have a kinetic energy that is larger than a given electric potential barrier. The detected signal therefore is a means to determine the energy distribution of the secondary charged particles.

Preferably, the tube voltage VT differs by more than +4000 V and even more preferred by more than +8000 V from the first voltage V1. This allows the tube voltage VT to be operated at a high voltage with respect to the voltage of the specimen. In principal, the higher the tube voltage VT relative to the voltage of the specimen, the more precise the focussing of the primary charged particles beam and the higher the spatial resolution of the measurements.

Preferably, the secondary charged particles are passed through a lens which is meant to focus the primary charged particles. This way, beam optical components for the separation of the secondary charged particles from the primary charged particles that otherwise would interfere with the beam optical components for the primary charged particles can be omitted.

BRIEF DESCRIPTION OF THE DRAWINGS

Some of the above-indicated and other more detailed aspects of the invention will be described in the following description and partially illustrated with reference to the figures. Therein:

FIG. 19a and FIG. 19b schematically show cross sections of a thirteenth embodiment of a retarding field analyzer according to the invention, which can be operated at a position which is asymmetric with respect to the optical axis, having high-ohmic electrodes for the retarding electric field region and the accelerating electric field region, whereby the thickness of the high-ohmic electrodes of the accelerating electric field region varies in axial direction.

DETAILED DESCRIPTION

FIGS. 1 to 4 have already been described in detail in the introduction of the application.

Figure 1A:
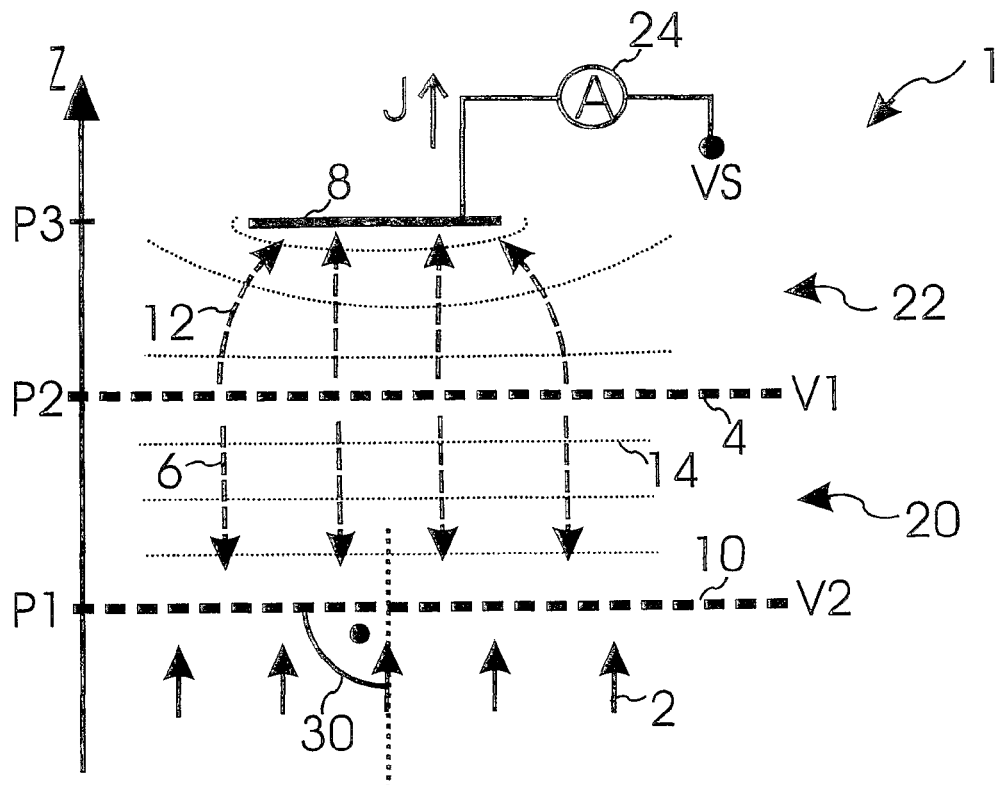
FIG. 1a and FIG. 1b schematically show the working principle of a known planar retarding field analyzer with the according electrical potentials below.
Figure 1B:
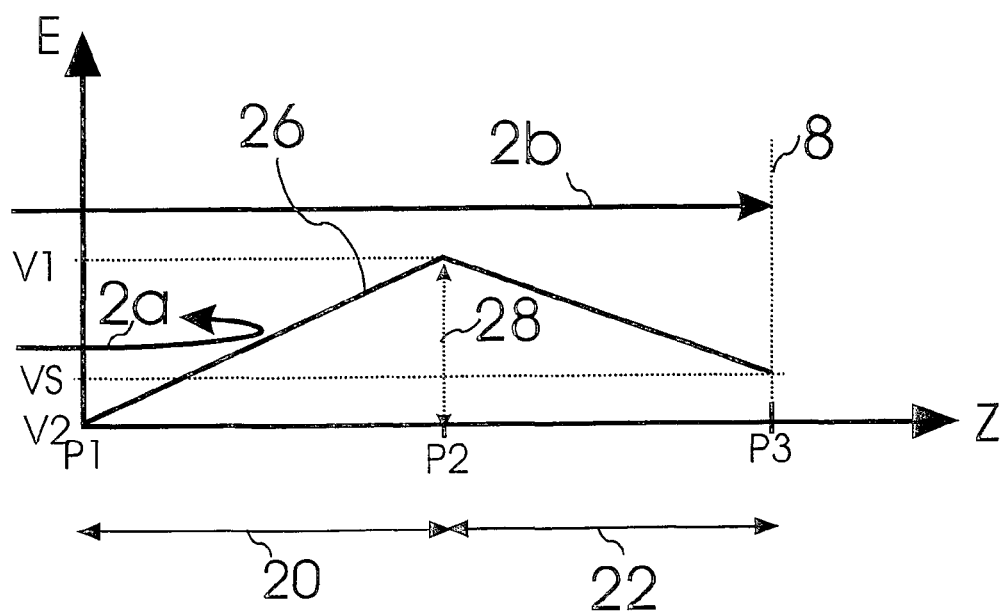
Figure 2A:
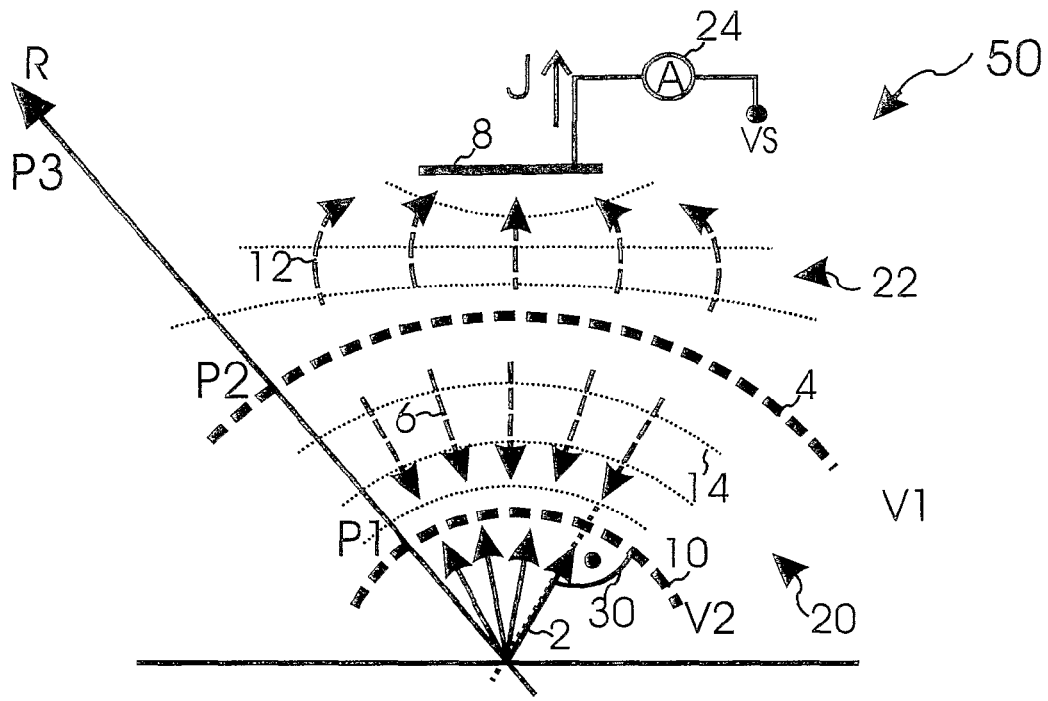
FIG. 2a and FIG. 2b schematically show the working principle of a known spherical retarding field analyzer with the according electrical potentials below.
Figure 2B:
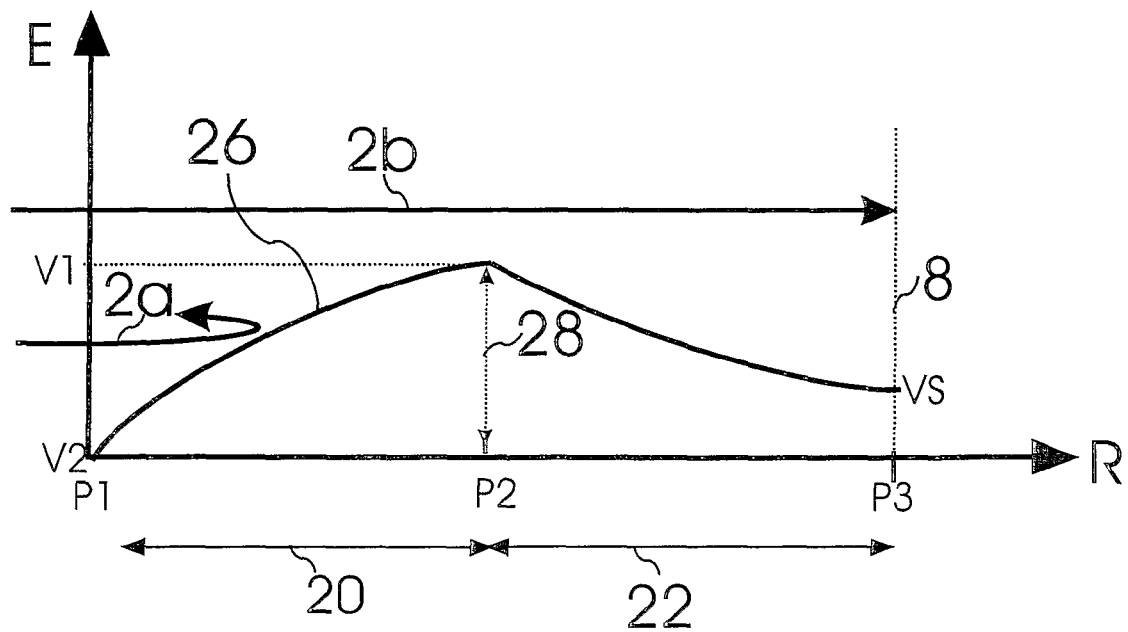
Figure 3:
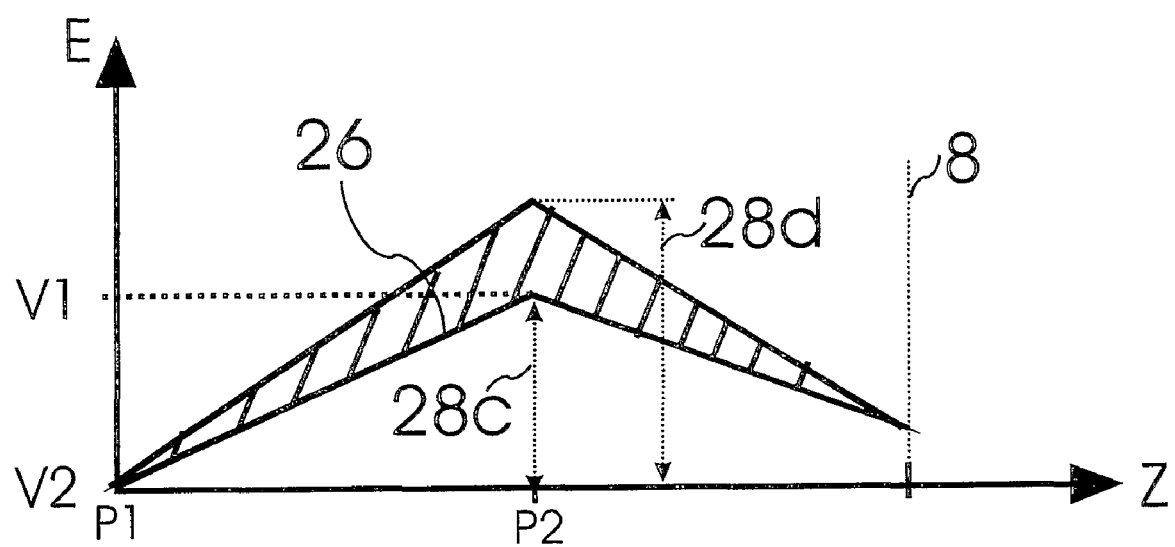
FIG. 3 illustrates the blurring of the potential barrier of a retarding electric field region with a stray field region.
Figure 4:
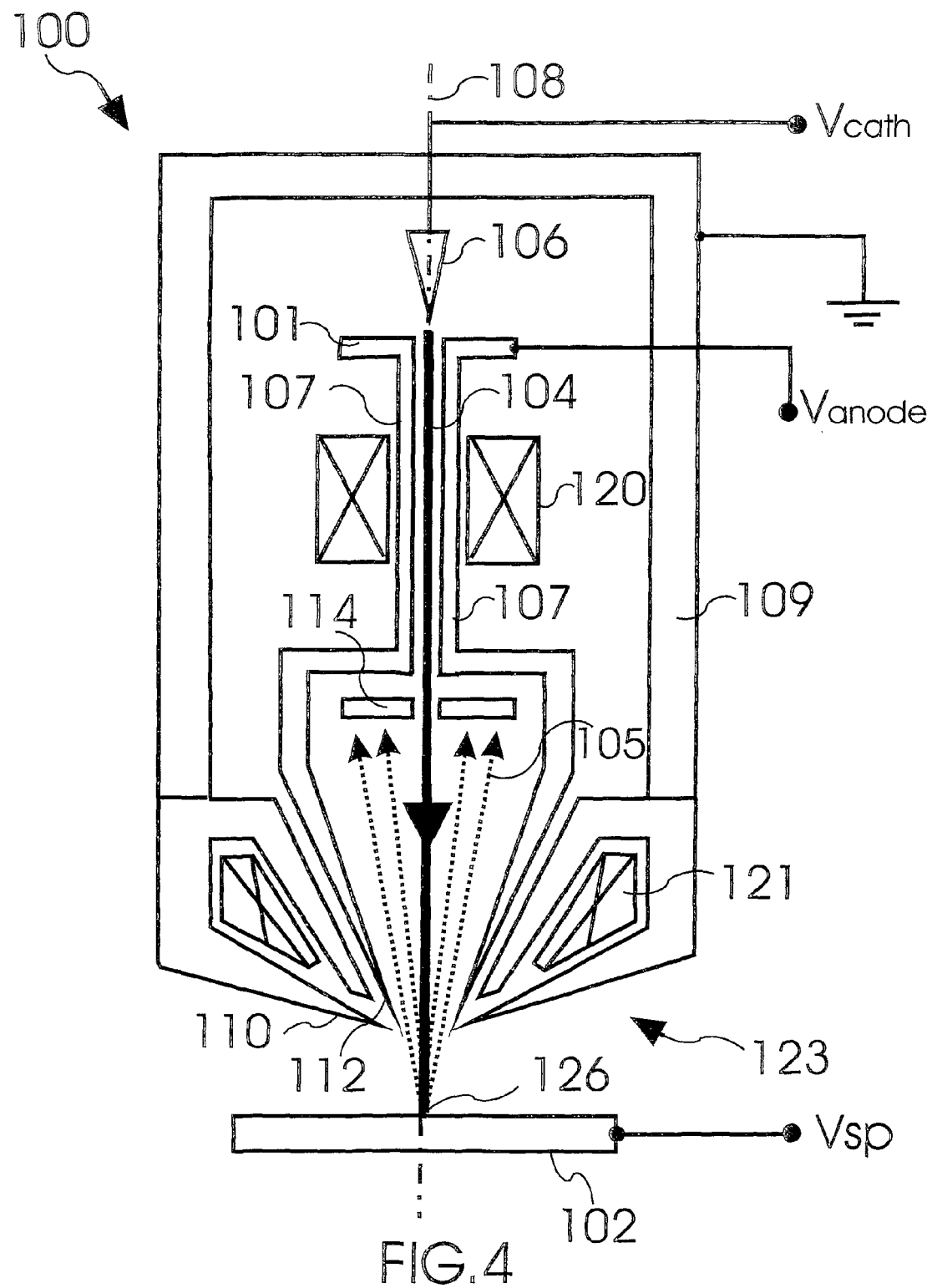
FIG. 4 schematically shows a known electron beam microscope with a high voltage beam tube, a combined electrostatic magnetic objective lens and an in-lens detector.
Figure 5:
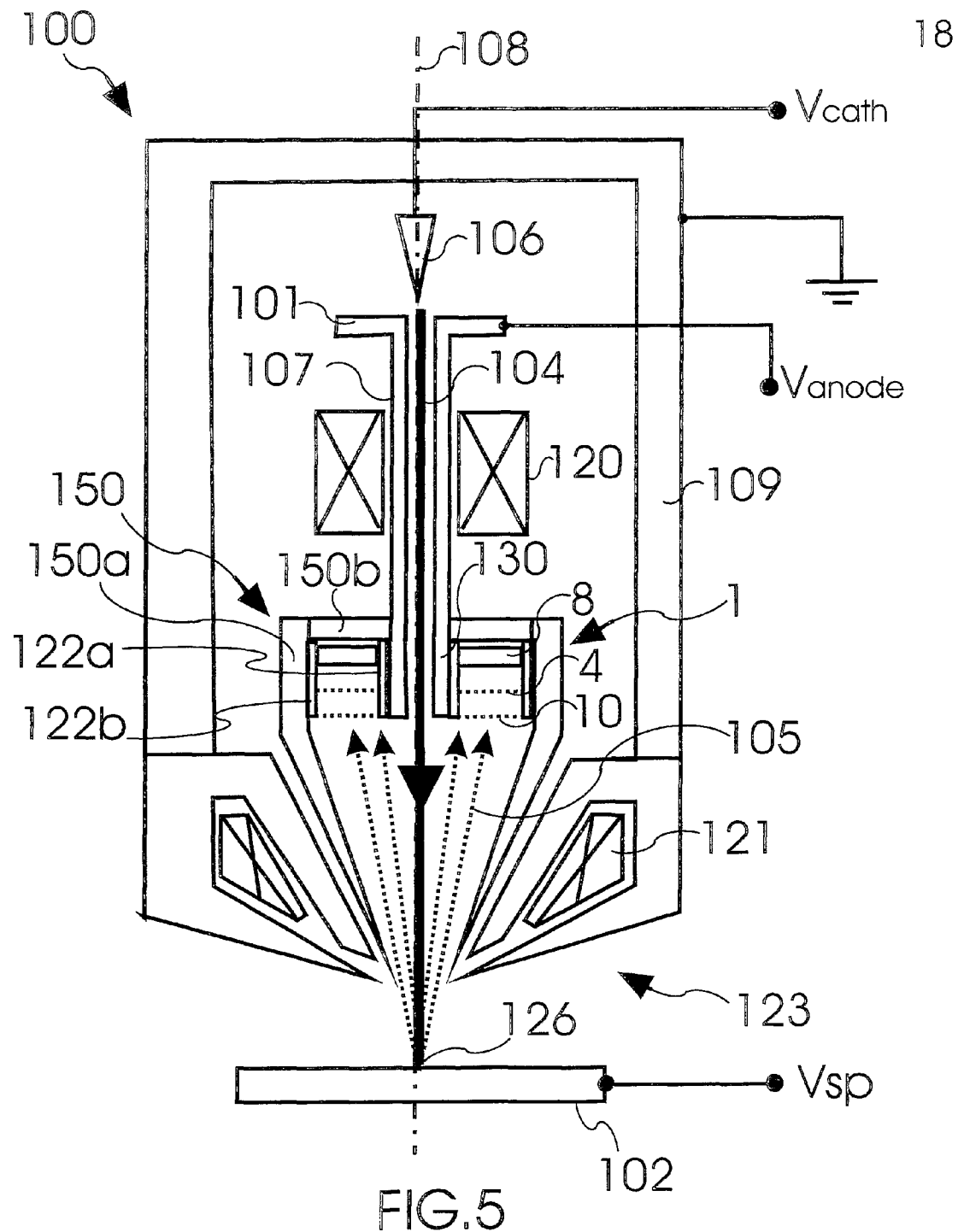
FIG. 5 schematically shows an electron beam microscope according to the invention with a high voltage beam tube and a retarding field analyzer.

FIG. 5 shows a cross section of a first embodiment of a charged particle beam device according to the invention, i.e. a cross section of an electron beam microscope 100. The electron beam microscope 100 like the one shown in FIG. 4 comprises a high voltage beam tube 107 and a combined electrostatic magnetic focus lens 123. However, in this embodiment, an in-lens planar retarding field analyzer 1 is used to discriminate the incoming secondary charged particles 105 according to their energy. For an electron beam device, the term "secondary charged particles" refers equally to secondary electrons (energy smaller than 50 eV, by definition) and backscattered electrons (energy larger than 50 eV, by definition).

The high energy resolution capabilities of a retarding field analyzer 1 allow different energy distributions of the incoming secondary charged particles 105 to be distinguished with high precision. The electron beam microscope 100 therefore can be used to measure electron spectra and/or to determine voltage contrast and material contrast on the surface of a specimen 102 with high spatial resolution and high contrast.

In order to protect the primary electron beam 104 from the electric field generated by the retarding field analyzer 1, the retarding field analyzer is fully enclosed within an electrically conducting further beam tube structure 150. In the embodiment of FIG. 5, the further beam tube structure 150 comprises the entrance grid electrode 10, the beam tube element 130 and two further beam tube structure elements 150a, 150b. In the following, the first beam tube structure element 150a is also referred to as outer shield 150a since it represents an outer boundary of the retarding field analyzer 1. On the other hand, the second further beam tube structure element 150b is referred to as detector shield 150b since it represents an outer boundary of the retarding field analyzer 1 on the detector side. The entrance grid electrode 10, the beam tube element 130, the outer shield 150a and the detector shield 150b are preferably at the same tube voltage VT in order to minimize electric interference of the electric field of the retarding electric field region with the primary electron beam 105.

The outer shield 150a in FIG. 5 is a conducting structure with a cylindrically shaped inner wall which is essentially coaxial to the beam tube element 130. The detector shield 150b functions as a lid for the cylinder formed by the cylindrically shaped inner walls of the outer shield 150a to fully enclose the filter grid electrode 4 and the charged particle detector 8 within the further beam tube structure 150. The detector shield 150b may also be formed by covering the outside of the charged particle detector 8 with some conducting layer that is electrically connected with the beam tube element 130.

Full enclosure of the retarding field analyzer 1 refers to the fact that the further beam tube structure 150 completely encloses the retarding field analyzer 1 with the exception of the openings in the entrance grid electrode 10. The openings are needed to let incoming secondary charged particles 105 enter into the retarding electric field. With a full enclosure, electric fields of the retarding field analyzer 1 are essentially not able to interfere with the primary electron beam 104 in a significant way, even when the voltage difference between the filter grid electrode 4 and the high voltage beam tube 107 is more than 2,000 Volts, preferably more than 4,000 Volts and even more preferred more than 10,000 Volts or even larger.

The retarding field analyzer in FIG. 5 is positioned at a large enough distance from the specimen to ensure that the secondary charged particles 105 generated at the interaction point 126 on the specimen 102 enter the planar entrance grid electrode 10 at a small, essentially vertical entrance angle.

Figure 6:
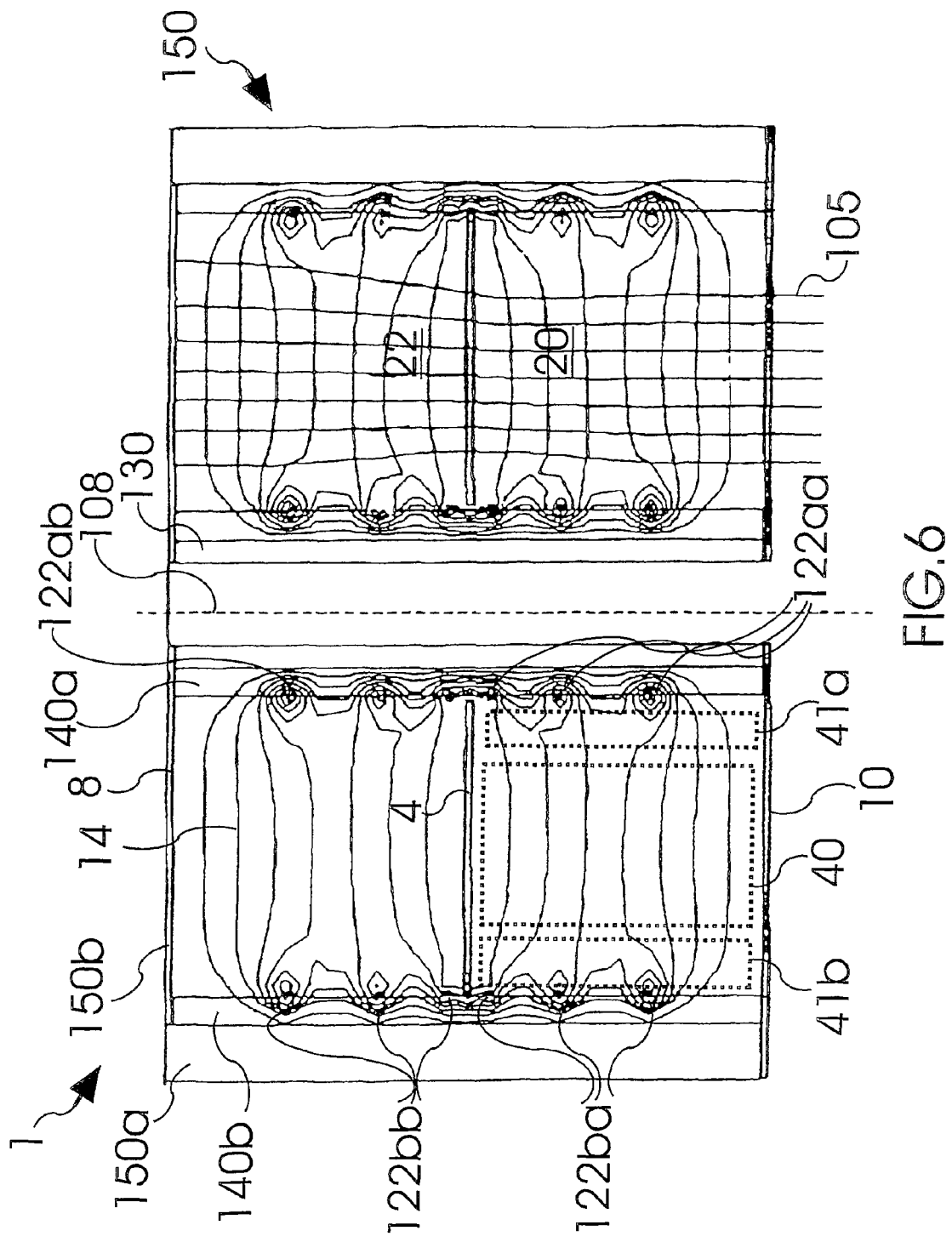
FIG. 6 schematically shows a first embodiment of a retarding field analyzer according to the invention with further electrode elements, for use in an electron beam microscope like in FIG. 5.

FIG. 6 schematically shows an enlarged cross section of a retarding field analyzer 1 according to the invention which can be integrated into the electron beam microscope of FIG. 5. The retarding field analyzer 1 of FIG. 6 is rotationally symmetric around the optical axis 108 along which the primary electron beam 104 passes. In addition, the retarding field analyzer 1 is a planar retarding field analyzer because of the coplanarity of the entrance grid electrode 10 with the filter grid electrode 4. The coplanarity between the entrance grid electrode 10 and the filter grid electrode is better than 1% relative to the distance between the entrance grid electrode 10 and the filter grid electrode 4 in order to provide a highly homogeneous retarding electric field region 20. The distance between the entrance grid electrode 10 and the filter grid electrode is as small as 5 mm, but can also be smaller.

The retarding field analyzer is further enclosed by the electrically conducting further beam tube structure 150 which defines the space left for the retarding field analyzer 1. The further beam tube structure 150 comprises the beam tube element 130 through which the primary electron beam 105 passes, the outer shield 150a, the entrance grid electrode 10 and the detector shield 150b which is a thin conducting layer (e.g. aluminum evaporated onto the scintillator) covering the detector 8. All elements of the further beam tube structure 150 are at the same tube voltage, e.g. VT=8000 V, to minimize interference of the electric field of the retarding electric field region 20 with the primary charged particle beam 104. Preferably, the tube voltage VT is equal to the voltage of the high voltage beam tube.

Figure 7:
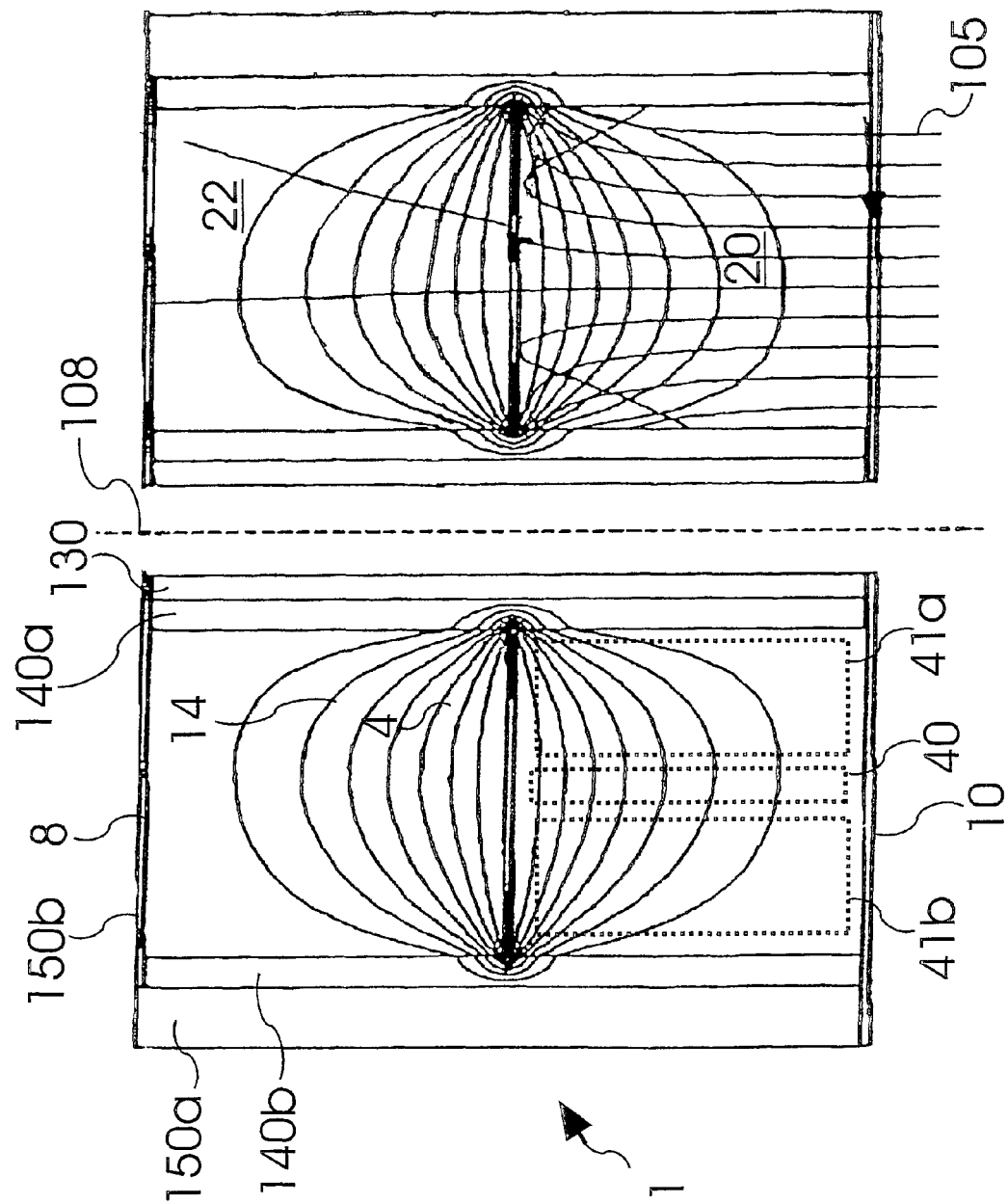
FIG. 7 schematically shows a retarding field analyzer without further electrode elements including the corresponding calculated equipotential lines for use in an electron beam microscope like in FIG. 5.
Figure 8:
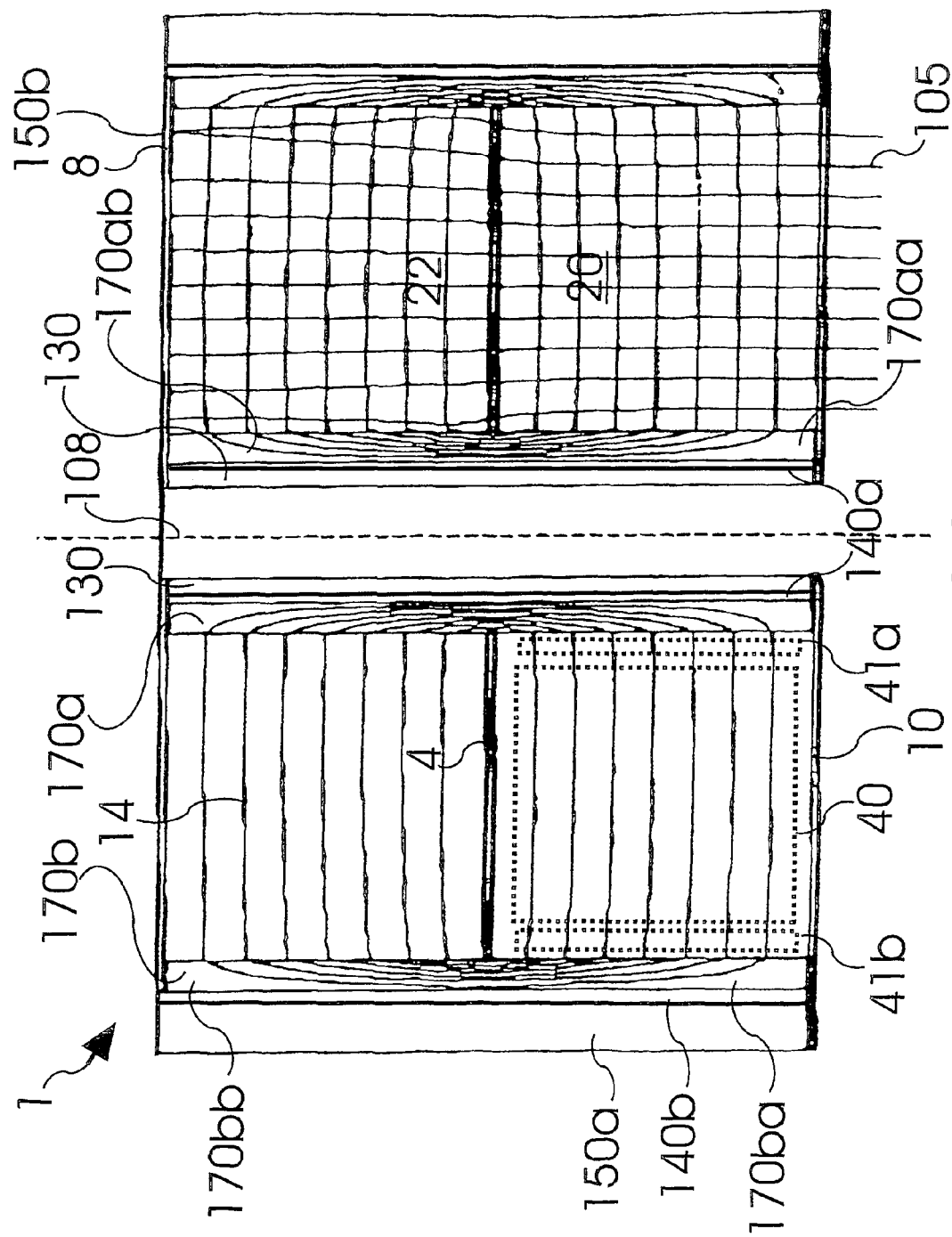
FIG. 8 schematically shows a second embodiment of a retarding field analyzer according to the invention with high-ohmic electrodes including the corresponding calculated equipotential lines.

The size of the further beam tube structure 150 defines the space left for the retarding field analyzer 1. In the embodiments of FIGS. 6, 7 and 8, the inner diameter of the beam tube element 130 is 1.5 mm, the outer diameter of the beam tube element 130 is 2 mm, the inner diameter of the outer shield 150a is 14.5 mm while the outer diameter of the outer shield 150a is 16.5 mm. Outer shield 150a and beam tube element 130 have cylindrical shapes which are essentially coaxial with respect to each other. The lengths of the cylinders of the beam tube element 130 and the outer shield 150a in FIGS. 6, 7 and 8 are 10 mm.

The space between the outer shield 150a and the beam tube element 130 is left for placing the retarding field analyzer 1. In the embodiments of FIGS. 6, 7 and 8, it was decided to divide the left space equally for the retarding electric field region 20 and accelerating electric field region 22. To do this, the filter grid electrode 4 is placed in the middle of the outer shield 150a in normal orientation with respect to the beam tube element 130, while the entrance grid electrode 10 is placed at the lower end of the outer shield 150a coplanar with the filter grid electrode 4. Also the detector shield 150b is placed at the upper end of the outer shield 150a coplanar with the filter grid electrode 4.

Entrance grid electrode 10 and detector shield 150b are electrically connected with the outer shield 150a and the beam tube element 130 to form together a conducting enclosure around the retarding field analyzer 1. Because of the electrical contact with the beam tube element 150, the further beam tube structure 150 has a voltage equal to the tube voltage VT.

In order to hold the filter grid electrode 4 and the inner and outer further electrode elements 122a, 122b in their respective positions, the outside of the beam tube element 130 is covered by a cylindrical inner insulating structure 140a, while the inside of the outer shield 150a is covered by a cylindrical outer insulating structure 140b. The walls of the inner and outer insulating structures 140a, 140b are, for example, 1000 µm thick. The material of the inner and outer insulating structures is a highly electrically insulating material, e.g. a ceramic, teflon, epoxy resin or peek, to withstand several thousand volts across the 1000 µm.

As mentioned before, the filter grid electrode 4 is placed in the middle of the outer shield 150a dividing the volume between the outer shield 150a and the beam tube element 130 in two equal parts. Consequently, the distance between the filter grid electrode 4 and the entrance grid electrode 10 is 5 mm, like the distance between filter grid electrode 4 and detector shield 150b.

The region below the filter grid electrode 4 represents the retarding electric field region 20. To reduce the size of the stray field region 41a near the beam tube element 130, three further electrode elements 122aa (lower inner further electrode elements) have been mounted to the surface of the inner insulating structure 140a. Each lower inner further electrode element 122aa has a ring-like shape coaxial with the beam tube element 130. Each of the lower inner further electrode elements 122aa therefore is referred to as ring electrode.

The positions of the lower inner and outer ring electrodes 122aa, 122ba of FIG. 6 along the direction of the optical axis 108 are as follows: the lower inner and outer ring electrodes 122aa, 122ba closest to the filter grid electrode 4 are each placed at a distance of 500 µm away from the filter grid electrode 4, the second-closest inner and outer ring electrodes 122aa, 122ba are placed at a distance of 1500 µm away from the filter grid electrode 4, and the third-closest inner and outer ring electrodes 122aa, 122ba are placed at a distance of 3000 µm away from the filter grid electrode 4.

The region above the filter grid electrode 4 represents the accelerating electric field region 22. As for the retarding electric field region 20, three further inner electrode elements 122ab have been mounted on the surface of the inner insulating structure 140a and three further outer electrode elements 122bb (upper outer further electrode elements) have been mounted on the surface of the outer insulating structure 140b, to reduce the size of the stray field region near the beam tube element 130 in the accelerating electric field region 22. As for the retarding electric field region 20, each upper inner further electrode elements) 122ab, and the upper outer further electrode elements 122bb, have a ring-like shape coaxial with the beam tube element 130 and, therefore, are referred to as ring electrodes.

The positions of the upper inner and outer ring electrodes 122ab, 122bb of FIG. 6 along the direction of the optical axis 108 are symmetric with respect to the electrodes of the retarding electric field region 20: the upper inner and outer ring electrodes 122ab, 122bb closest to the filter grid electrode 4 are each placed at a distance of 500 µm away from the filter grid electrode 4, the second-closest inner and outer ring electrodes 122ab, 122bb are placed at a distance of 1500 µm away from the filter grid electrode 4 and the third-closest inner and outer ring electrodes 122ab, 122bb are placed at a distance of 3000 µm away from the filter grid electrode 4.

The geometrical symmetry of the electrode positions of the retarding electric field region 20 with the electrode positions of the accelerating electric field region 22 with respect to a reflection at the filter grid electrode plane provides that the equipotential lines 14 of the retarding electric field region 20 are symmetrical to the equipotential lines 14 of the accelerating electric field region with respect to a reflection at the filter grid electrode plane.

In FIG. 6, the potentials of the six inner further electrode elements 122aa, 122ab and the six outer further electrode elements 122ba, 122bb in FIG. 6 are equal to the first voltage V1 of the filter grid electrode 4. Such a layout simplifies the construction of the retarding field analyzer 1, since no additional external voltage source is needed. However, it would also be possible to choose the voltages for the further electrode elements freely to further minimize the stray field region 41a,b.

The three lower inner further electrode elements 122aa reduce the size of a first stray field region 41a in the retarding electric field region 20 near the beam tube element 130, while the outer further electrode elements 122b reduce the size of a second stray field region 41b of the retarding electric field region 20 near the outer shield 150b. As a result, the coplanar field region 40 with the coplanar equipotential lines 14 in the retarding electric field region 20 is large and extends far into the regions near the inner beam tube element 130a and outer beam tube element 130b.

The coplanar field region 40 is usually defined as the area within which the retarding electric field region 20 provides a sufficient homogeneous retarding electric field to meet a given energy resolution specification. The energy resolution specification for a retarding field analyzer within the electron beam microscope with a high voltage beam tube having a voltage of 8000 V is high for voltage contrast or material contrast measurements. For voltage contrast or material contrast measurements, it is typically necessary to resolve the energy of incoming secondary charged particles within a few eV or less. However, with secondary charged particles 105 accelerated to 8000 eV or higher, this requires an energy resolution to better than 0.1% or preferably to better than 0.001%.

FIG. 6 shows the equipotential lines 14 that have been calculated using a tube voltage VT of +8000 V for the entrance grid electrode 10, the beam tube element 130, the outer shield 150a and the detector shield 150b. The filter grid electrode 4 and inner and outer ring electrodes 122aa, 122ab, 122ba, 122bb are at a first voltage V1 of −100 V.

In addition, on the right side of the retarding field analyzer 10 of FIG. 6, trajectories of secondary charged particles 105 entering the entrance grid electrode 10 in the direction of the filter grid electrode 4 have been drawn. The trajectories correspond to secondary charged particles that have passed vertically through the entrance grid electrode at an energy of 8200 eV. The energy of 8200 eV is higher by 100 eV compared to the potential barrier given by the voltage difference between entrance grid electrode 10 and filter grid electrode 4. The trajectories of the secondary charged particles 105 demonstrate that most secondary charged particles are able to pass the filter grid electrode 4 independent of the position of where they enter retarding electric field region 20. Correspondingly, the coplanar field region 40 in FIG. 6 is large compared to the coplanar field region 40 of FIG. 7.

The filter grid electrode 4 is set to a first voltage V1 of −100 V, in order to discriminate against the incoming secondary charge particles 105 coming from the specimen 102 which in this case is at ground potential. The energy of the secondary charged particles 105 is set at 8200 eV since this value represents a representative energy for secondary charged particles that are generated on a specimen 102 which is at ground potential and which are subsequently accelerated by the entrance grid electrode 10 which is at +8000 V.

Due to the voltage difference of 8000 V between the specimen 102 and the entrance grid electrode 10, the secondary charged particles are accelerated to energies of 8000 eV or higher when they arrive at the entrance grid electrode 10. Then, due to the voltage difference of 8100 V between the second voltage V2 of the entrance grid electrode 10 and the first voltage V1 of the filter grid electrode 4, the retarding electric field 6 represents a potential barrier 26 for the incoming secondary charged particles 105 with a potential barrier height of 8100 eV. The secondary charged particles 105 pass through the entrance grid electrode 10 to enter the retarding electric field region 20 where they decelerate due to the potential barrier.

The symmetrical arrangement of the electrodes 122aa, 122ba of the retarding electric field region 20 compared to the arrangement of the electrodes 122ab, 122bb within the retarding electric field region 20 ensures that the stray field regions within the accelerating electric field region 22 (not explicitly shown in FIG. 6) are of the same size as the stray field regions 41a, 41b within the retarding electric field region 20. Accordingly, most secondary charged particles that have passed through the filter grid electrode 4 are accelerated by the accelerating electric field region 22 in a straight line towards the electron detector 8 as can be seen from FIG. 6. This way, few secondary charged particles that have passed the filter grid electrode 4 are deflected towards the walls of the retarding field analyzer 1 and, accordingly, most secondary charged particles can be detected by the detector 8.

The dimensions of the retarding field analyzer of FIG. 6 are adjusted to the space that is available for placing a retarding field analyzer into the electron beam microscope of FIG. 5. Generally, the size and dimensions of the retarding field analyzer 1 are not critical to the concept of reducing the stray field region by means of an at least one further electrode element. However, the smaller the size of the retarding field analyzer 1 is the more critical are the aspects of high voltage interference, stray fields and detection area.

The entrance grid electrode 10 and the filter grid electrode 4 are both made of a conducting mesh, e.g. made of copper, in order to be both electrically conducting and transparent for incoming secondary charged particles. The mesh of the entrance grid electrode 10 typically has a bar width of 20 µm and a pitch of 200 µm yielding a transparency of 82%, while the mesh of the filter grid electrode 4 typically has a bar width of 3 µm and a pitch of 30 µm, yielding a transparency of 82% as well. Generally, the smaller the openings in the mesh, the smaller the fringe fields; however, a lower limit for the openings is given by the requirement to provide the entrance grid electrode and filter grid electrode with a sufficient transparency.

Further, the meshes of the entrance grid electrode 10 and the filter grid electrode 4 are aligned to each other in order that a maximum number of openings of the filter grid electrode 4, at a vertical projection onto the entrance grid electrode 10, coincides within the openings of the entrance grid electrode 10. In this way, the combined transparency of the entrance grid electrode 10 and filter grid electrode 4 together is further increased to obtain a high detection efficiency of the retarding field analyzer.

Note that it is also possible that the entrance grid electrode, instead of being a mesh, is a ring-like structure having only one opening. In this case, the transparency is almost 100%. However, depending of the size of the retarding field analyzer, the homogeneity of the electric field of the retarding field region may suffer.

The distance between the entrance grid electrode 10 and the filter grid electrode 4 in FIGS. 6, 7 and 8 is 5 mm. With the entrance grid electrode 10 at 8000 V and the filter grid electrode 4 at −100 V, the retarding electric field region 20 has a field strength of about 1600 V/mm. Further, the distance between the charged particle detector 8 and the filter grid electrode is also about 5 mm. Since the charged particle detector 8 is at a potential equal to the beam tube element 130, the field strength within the accelerating electric field region 22 is 1600 V/mm as well. The accelerating electric field within the accelerating electric field region 22 serves to accelerate the incoming electrons that have passed the filter grid electrode 4 to increase the detection efficiency.

The charged particle detector 8 in FIGS. 6, 7 and 8 is a scintillator 8 with a planar entrance window to the incoming secondary particles. The scintillator 8 covers the full region between the outer shield 150a and the beam tube element 130 in order to detect essentially all secondary charged particles that have passed the filter grid electrode 4. In one preferred embodiment, the charged particle detector 8 is segmented, e.g. by the use of a segmented scintillator or by the use of segmented detectors like a micro-channel plate or CCD. The segmentation helps to detect the secondary charged particles with spatial resolution. The spatial resolution of the secondary charged particles can deliver additional information about the specimen 102 that is under inspection. The scintillator 8 is used to detect the incoming secondary charged particles.

It should be mentioned that the retarding field analyzer 1 of FIG. 6 can also be operated in a mode where the first voltage V1 is set to the tube voltage VT. In this case, filter grid electrode 4 and the further electrode elements 122aa, 122ab, 122ba, 122bb would all have a voltage equal to the tube voltage VT. In this case, the field strength of the retarding electric field region 20 and the accelerating electric field region 22 would be zero and no secondary charged particles 105 would be rejected by an electric potential barrier. In this case, the retarding field analyzer 1 is operated as a charged particle detector without an energy discriminating retarding field filter, which for some applications is a preferred mode of operation.

FIG. 7 shows a retarding field analyzer 1 having the same electrode configuration as the one in FIG. 6, with the exception that no further electrode elements 122 are provided. With the missing further electrode elements 122, the stray field regions 41a, 41b extend almost to the center of the retarding electric field region 20 or, in other words, the coplanar field region 40 is small compared to the coplanar field region 40 of FIG. 6. As a consequence, most trajectories of the secondary charged particles enter the retarding electric field region 20 within the stray field regions 41a and 41b. The stray field regions 41a, 41 in turn deflect the secondary charged particles to the degree that they cannot pass the filter grid electrode 4, even though their energy of 8200 eV is significantly higher than the nominal potential barrier height of 8100 eV. Only secondary charged particles that enter into the small coplanar field region 40 succeed in passing the filter grid electrode 4, as can be seen by the straight line of the central trajectory. As a consequence, only a small fraction of the retarding electric field region 20 provides a sufficient field homogeneity to be used for a discrimination of secondary charged particles with a high energy resolution.

FIG. 8 shows another embodiment of the invention. The beam tube element 130, the outer shield 150a, the detector shield 150b, the inner insulating structure 140a, the outer insulating structure 140b, the entrance grid electrode 10 with its second voltage V2, the filter grid electrode 4 with its first voltage V1 and the charged particle detector 8 are arranged like in FIG. 6 and FIG. 7. However in FIG. 8, the at least one further electrode elements, i.e. the lower inner high-ohmic electrode 170aa, the upper inner high-ohmic electrode 170ab, the lower outer high-ohmic electrode 170ba and the upper outer high-ohmic electrode 170bb, are made of high-ohmic material, e.g. a mixed ceramic made of aluminum nitride-titanium nitride.

In the embodiment of FIG. 8, the lower inner high-ohmic electrode 170aa between the entrance grid electrode 10 and the filter grid electrode 4 and the upper inner high-ohmic electrode 170ab between the filter grid electrode 4 and the detector shield 150b are formed as one cylindrically shaped jacket which is also referred to as inner high-ohmic cylinder 170a. The outer diameter of the inner high-ohmic cylinder 170a is 2.8 mm, while the inner diameter inner high-ohmic cylinder 170a is 2.2 mm. The thickness of the high-ohmic cylinder 170a therefore is 0.3 mm.

Analogously, the lower outer high-ohmic electrode 170ba between the entrance grid electrode 10 and the filter grid electrode 4 and the upper outer high-ohmic electrode 170bb between the filter grid electrode 4 and the detector shield 150b are formed as another cylindrically shaped jacket which is referred to as outer high-ohmic cylinder 170b. The inner diameter of the outer high-ohmic cylinder 170a is 14 mm, while the outer diameter outer high-ohmic cylinder 170a is 14.6 mm. The thickness of the high-ohmic cylinder 170a in this case is again 0.3 mm.

In FIG. 8, the inner high-ohmic electrode 170a and the outer high-ohmic electrode 170b are each in electrical contact with the entrance grid electrode 10, the filter grid electrode 4 and the detector shield 150b. Like in FIGS. 6 and 7, the filter grid electrode 4 is at a first voltage V1 of −100 V, while the entrance grid electrode 10, the outer shield 150a and the detector shield 150b are at a second voltage V2 of +8000 V. Further, the cylindrically shaped inner insulating structure 140a between the beam tube element 130 and the inner high-ohmic electrode 170a electrically insulates the inner high-ohmic cylinder 170a from the beam tube element 130 along their adjacent cylindrical jacket faces. Similarly, the cylindrically shaped outer insulating structure 140b between the outer shield 150a and the outer high-ohmic electrode 170b electrically insulates the outer high-ohmic cylinder 170b from the outer shield 150a along their adjacent cylindrical jacket faces. This way, no current can flow in a radial direction from the high-ohmic electrodes 170a, 170b to the beam tube element 130 or outer shield 150a.

However, due to the difference between the first and second voltage V1 and V2, a small current flows in each high-ohmic cylinder 170a, 170b from the entrance grid electrode 10 to the filter grid electrode 4, and from the charged particle detector 8 to the filter grid electrode 4. Due to the axial symmetry of the cylindrically shaped high-ohmic electrodes 170a, 170b with respect to the optical axis 108, the currents are equally distributed within the coaxial cross section of the cylinders. Due to Ohm's law, the currents generate electric potentials on the walls of the cylinders that continuously decrease along the direction of the optical axis 108 going from entrance grid electrode 10 to filter grid electrode 4 or from detector shield 150b to filter grid electrode 4.

Due to the cylindrical shape of the inner and outer high-ohmic cylinders 170a, 170b, and due to the constant thickness of the high-ohmic cylinder jackets, the electric potentials on the walls of the cylinders vary essentially linearly in the direction of the optical axis 108. The according potentials result in a significant reduction of the size of the stray field regions 41a and 41b compared to the stray field region 41a and 41b in FIG. 7. In other words, the homogeneity of the electric field within the retarding electric field region 20 is high even when it is close to the beam tube element 130 and the outer shield 150a, as can be seen from the equipotential lines 14 in FIG. 8. Again, as can be seen on the right hand side of FIG. 8, the trajectories of incoming 8200 eV electrons indicate that all of them are able to pass through the filter grid electrode. This is to be compared with the trajectories in FIG. 7, where most of the electrons do not pass through the filter grid electrode 4.

The thickness of the high-ohmic cylinder jackets 170a, 170b, as well as the choice of the high ohmic material, depends on the application and the dimensions of the retarding field analyzer 1. Typically, the resistivity of the high-ohmic material is between $10^7$ and $10^{13}$ Ωcm, or preferred between $10^9$ and $10^{11}$ Ωcm. A suitable high-ohmic material is e.g. a ceramic mixed of aluminum-nitride and titanium-nitride or aluminum oxide, or epoxy resin with ZELEC™. The resistance of the high-ohmic cylinders is usually chosen to make a compromise between the desire to have a low resistance to avoid charge up with charged particles striking the cylinders, and the desire to avoid high currents that would heat the high-ohmic cylinder jackets. Typically, the current flowing between entrance grid electrode 10 and filter grid electrode 4 is smaller than 1 μA.

The present invention applies to many different modifications of the examples described so far. The modification may be chosen depending e.g. on the application, on the available space in which the retarding field analyzer has to be implemented, the precision of the retarding electric field needed for a required energy resolution, the allowed complexity of the electrodes and cost. To give an idea of the diversity of different embodiments of the invention, a few retarding field analyzers according to the invention are described below.

Figure 9A:
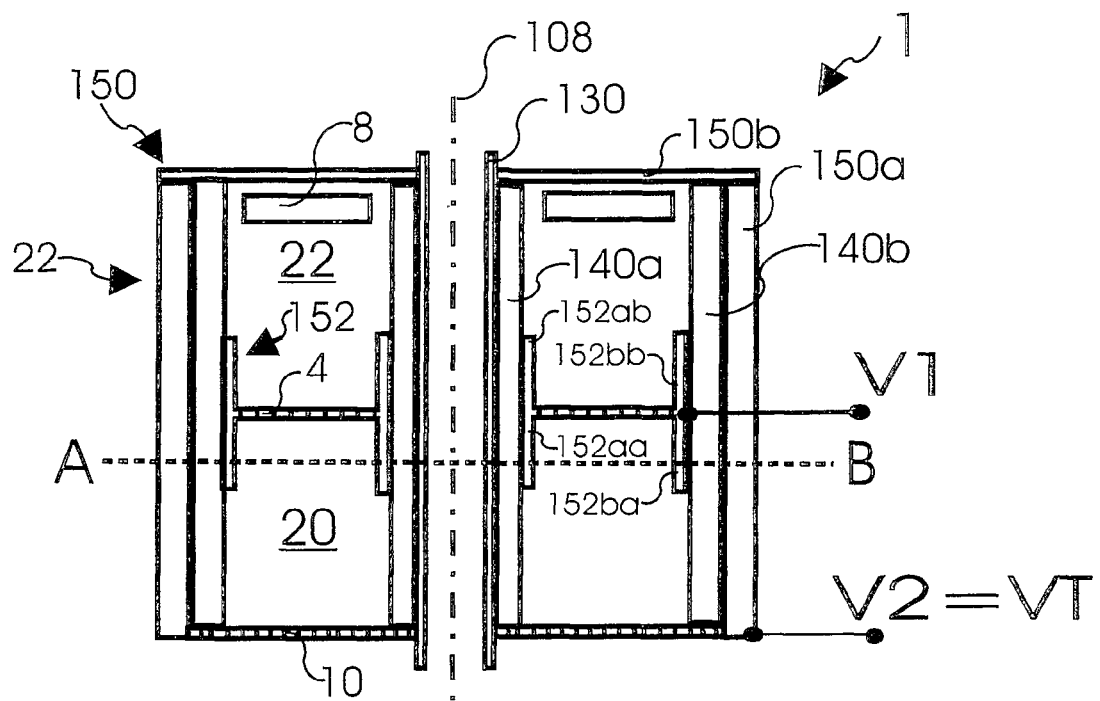
FIG. 9a and FIG. 9b schematically show a third embodiment of a retarding field analyzer according to the invention with a ring electrode being rigidly connected with the filter grid electrode, for use in an electron beam microscope.
Figure 9B:
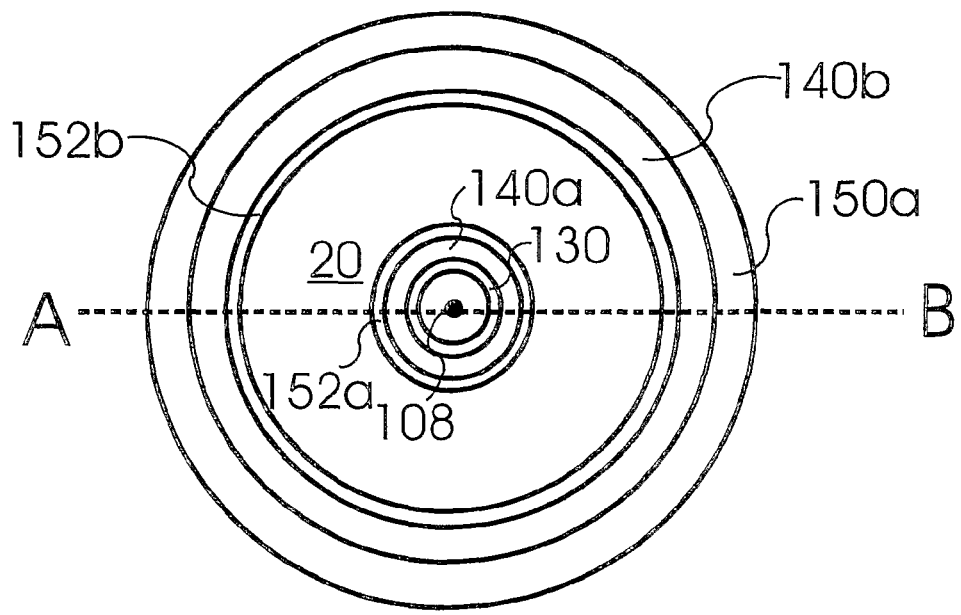

FIGS. 9a and 9b show a planar retarding field analyzer 1 like the one shown in FIG. 6 with the difference that the six inner further electrodes 122aa, 122ab and the six outer further electrodes 122ba, 122bb are replaced by further electrode elements referred to as rigid ring electrodes 152. Like the ring electrodes 122 of FIG. 6, the rigid ring electrodes 152 are divided into inner rigid ring electrodes 152aa, 152ab having a small first diameter and outer rigid ring electrodes 152ba, 152bb having a larger second diameter. Further, the lower rigid ring electrodes 152aa, 152ba refer to the electrodes which are positioned between the entrance grid electrode 10 and filter grid electrode 4, while the lower rigid ring electrodes 152ab, 152bb refer to the electrodes which are positioned between filter grid electrode 4 and the detector shield 150b.

The rigid ring electrode 152 differs from the ring electrode 122 in that the rigid ring electrode 152 and the filter grid electrode 4 are one rigid body. The filter grid electrode 4 portion and the ring electrode 152 portion of the rigid body can be distinguished from each other by the fact that the rigid ring electrode portion does not serve as a filter that is able to let incoming charged particles pass through. The rigid ring electrode portion is also distinguishable from the filter grid electrode 4 portion by the fact that the ring electrode 152 stands off the plane of the filter grid electrode 10.

The rigid ring electrodes 152 serve to decrease the size of the stray field regions 41a, 41b in the same way as the further ring electrodes 122 do in the embodiment of FIG. 6 and may comprise an inner rigid ring electrode 152a. However, the filter grid electrode 4 and the rigid ring electrodes 150 can be manufactured as one rigid body of the same material, which simplifies manufacturing, reduces costs and complexity and improves the stability of the structure of the retarding field analyzer.

The retarding field analyzer 1 of FIG. 9a-b is further enclosed within a further beam tube structure 150 consisting of the beam tube element 130, the first and second further beam tube structure elements 150a and 150b (i.e. the outer shield 150a and detector shield 150b) and the entrance grid electrode 10, which are all at the same voltage tube voltage VT. The further beam tube structure 150 serves to shield the retarding electric field region 20 from electric fields from outside the retarding field analyzer 1. It further shields the regions outside the retarding field analyzer 1 from the electric fields of the filter grid electrode 4.

FIG. 9b shows a cross section of the retarding field analyzer of FIG. 9a along the AB-Plane in the retarding electric field region 20. The cross section of the retarding field analyzer 1 of FIG. 9b is circular and essentially coaxial with the optical axis 108. FIG. 9b illustrates that the rigid ring electrodes 152aa, 152ab are rotationally symmetrically aligned with respect to the optical axis 108 in order to reduce the stray field regions 41a, 41b near the inner beam tube element 130a and the outer beam tube element 130b. However, the cross section can also have other shapes if necessary, e.g. in order to fit the retarding field analyzer 1 within the limited space within a charged particle beam device.

Figure 10A:
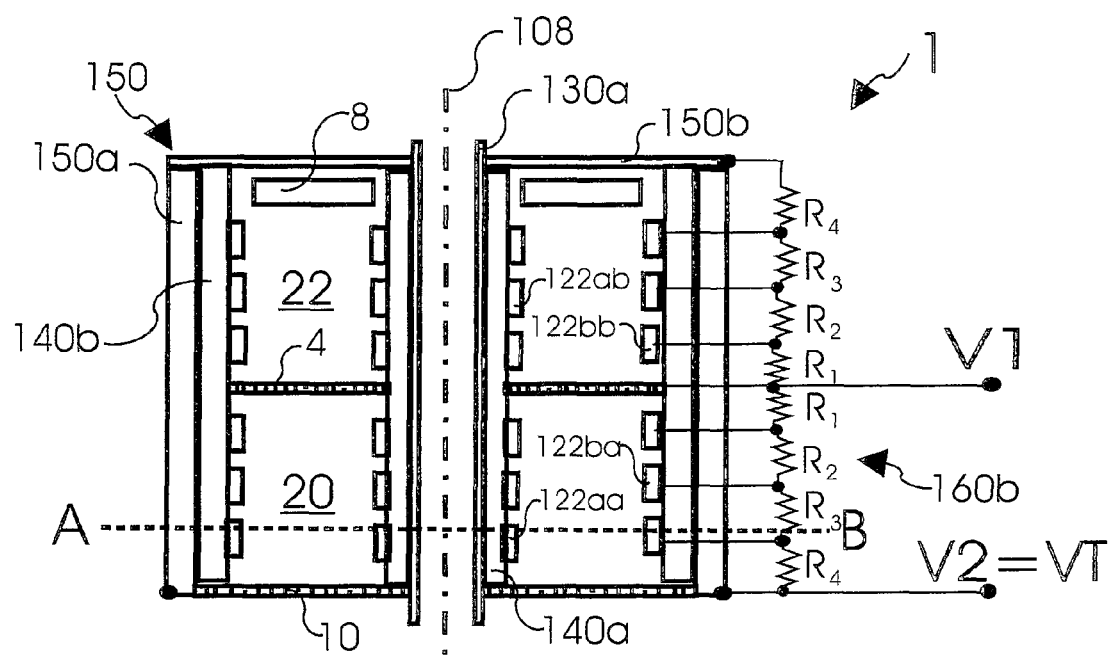
FIG. 10a and FIG. 10b schematically show a fourth embodiment of a retarding field analyzer according to the invention with different voltages on the further electrode element, for use in an electron beam microscope.
Figure 10B:
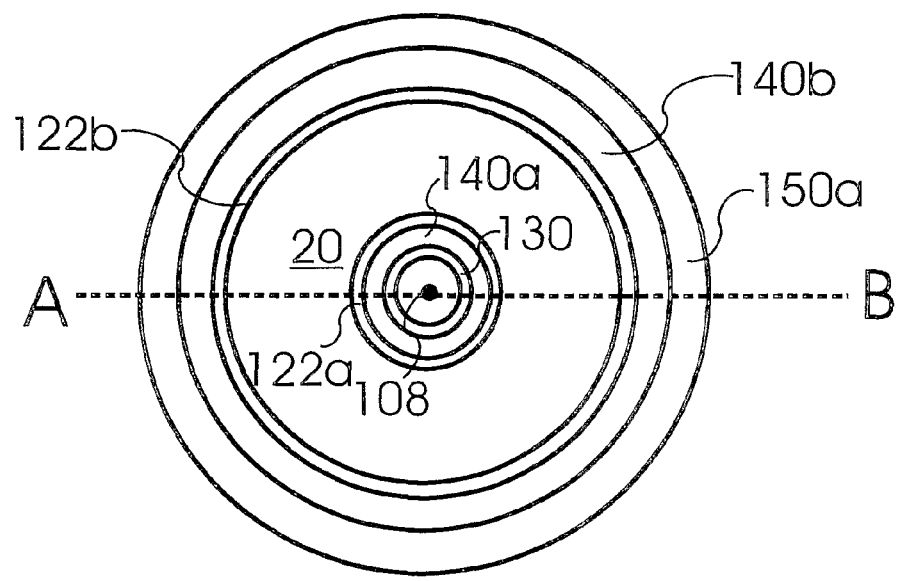

FIGS. 10a and 10b show another planar retarding field analyzer 1 similar to the one shown in FIG. 6 with the difference that the voltages of the ring electrodes 122aa, 122ba, 122ab, 122bb are different from the voltage of the filter grid electrode 4 in order to further improve the homogeneity of the electric field within the retarding electric field region 20 and the accelerating electric field region 22, i.e. to reduce the size of the stray field regions 41a, 41b of FIG. 7. In a preferred embodiment, the different voltages of the outer further ring electrodes 122ba, 122bb are provided by an outer voltage divider 160b which connects the first voltage V1 of the filter grid electrode 4 with the second voltage V2 of the entrance grid electrode 10 through a first set of resistors R1, R2, R3 and R4. In the embodiment of FIGS. 10a and 10b, the voltage divider 160b also connects the first voltage V1 of the filter grid electrode 4 with the second voltage V2 at the beam tube element 130 through a same second set of resistors R1, R2, R3 and R4. Since the entrance grid electrode 10, the beam tube element 130, the detector shield 150b and the outer shield 150a are electrically connected with each other to have the same tube voltage V1, the voltages of the outer electrodes 122ba at the retarding electric field region 20 are the same as the voltages of the outer electrodes 122bb at the accelerating electric field region 20.

The voltages at the outer ring electrodes 122ba, 122bb are generated through the voltage drops caused by the resistors R1, R2, R3, R4 of the voltage divider 160b. In the embodiment of FIG. 10a, the resistors R1, R2, R3, R4 have the same resistance in order to have the same voltage drops between neighboring ring electrodes. As a result, the voltages of the lower outer ring electrodes 122ba decrease the further away a lower outer ring electrode 122ba is from the entrance grid electrode 4 and, analogously, the voltages of the upper outer ring electrodes 122bb increase the further away an upper outer ring electrode 122ba is from the filter grid electrode 4. Such voltage chains connected with the ring electrodes 122ba, 122bb can provide a better homogeneity of the electric field within the retarding electric field region 20 (or accelerating electric field region 22) compared to a constant voltage of the electrodes like in FIG. 6.

Not shown in FIG. 10a is an inner first voltage divider to generate the voltages for the inner ring electrodes 122aa, 122ab. For reasons of symmetry, the resistors of the inner voltage divider are the same as the resistors of the outer voltage divider 160b. Further, in the direction of the optical axis 108, the positions of the inner ring electrodes 122aa, 122ab, are the same as the positions of the outer ring electrodes 122ba, 122bb. Such an inner voltage divider 160a connected with the ring electrodes 122ba, 122bb decreases the size of the stray field regions 41a near the beam tube element 130 compared to a constant voltage of the electrodes, like in FIG. 6.

FIG. 10b shows a cross section of the retarding field analyzer along the AB-line of FIG. 10a in a plane normal to the optical axis 108. As before, the inner insulating structure 140a, the inner ring electrode 122a, the outer ring electrode 122b, the outer insulating structure 140b and the outer shield 150a are essentially coaxial with the optical axis 108 and the beam tube element 130.

Figure 11A:
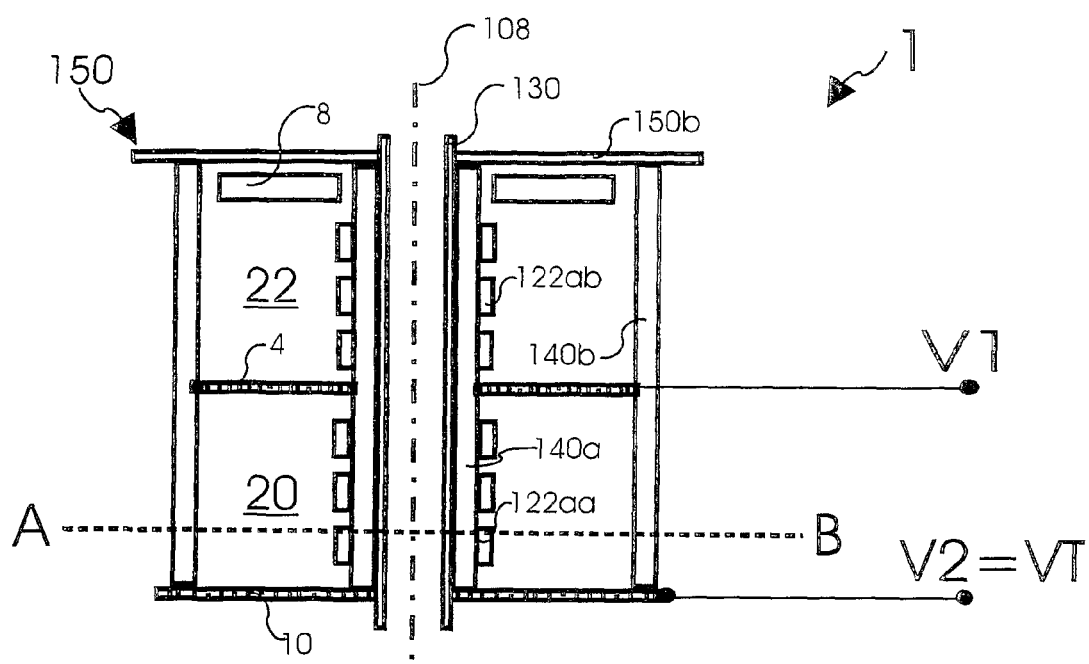
FIG. 11a and FIG. 11b schematically show a fifth embodiment of a retarding field analyzer according to the invention without an outer shield, for use in an electron beam microscope.
Figure 11B:
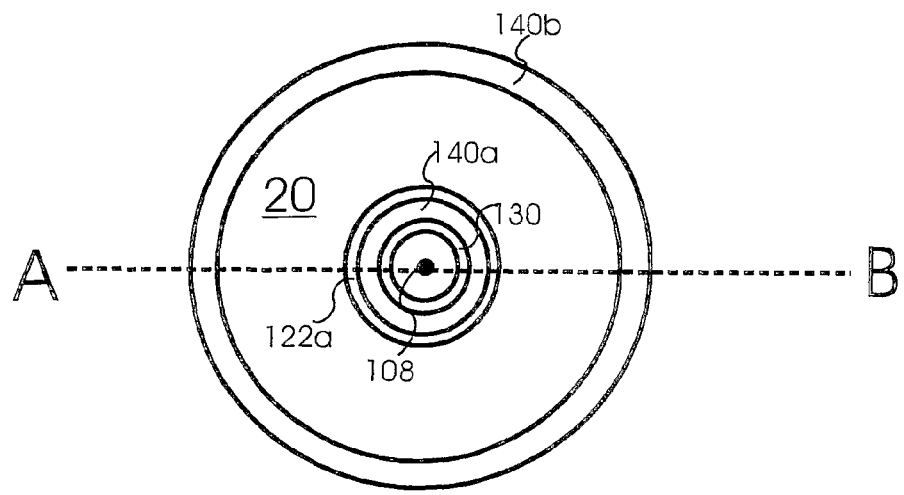

FIG. 11a and FIG. 11b show another embodiment according to the invention. FIG. 11a is identical to the retarding field analyzer 1 of FIG. 10, with the difference that no outer beam tube element 150a and no outer ring electrodes 122b are provided. Accordingly, the further beam tube structure 150, which consists of the inner beam tube element 130, the detector shield 150b and the entrance grid electrode 10, is weakened in its electrostatic shielding capacity. However, the simplification of the further beam tube structure 150 simplifies the design of the retarding field analyzer 1. The outer insulating structure merely serves to hold the filter grid electrode 4, the entrance grid electrode 10 and the detector shield 150b. Again, the voltages for the further ring electrodes 122aa, 122ab are provided by means of a voltage divider 160 (not shown) or by individual voltage supplies providing third voltages V3 to the further ring electrodes which correspond to the lower inner further electrode elements 122aa, and fourth voltages V4 to the further ring electrodes which correspond to the upper inner further electrode elements 122aa. However, it is also possible to provide the same first voltage V1 to the ring electrodes as shown in FIG. 6.

FIG. 11*b* illustrates a cross section of the retarding field analyzer 1 of FIG. 11*b* in the retarding electric field region 20 in a plane normal to the optical axis 108. As before, the inner insulating structure 140*a*, the inner ring electrodes 122*aa*, 122*ab* and the outer insulating structure 140*b* are essentially coaxial with the optical axis 108 and the beam tube element 130.

Figure 12A:
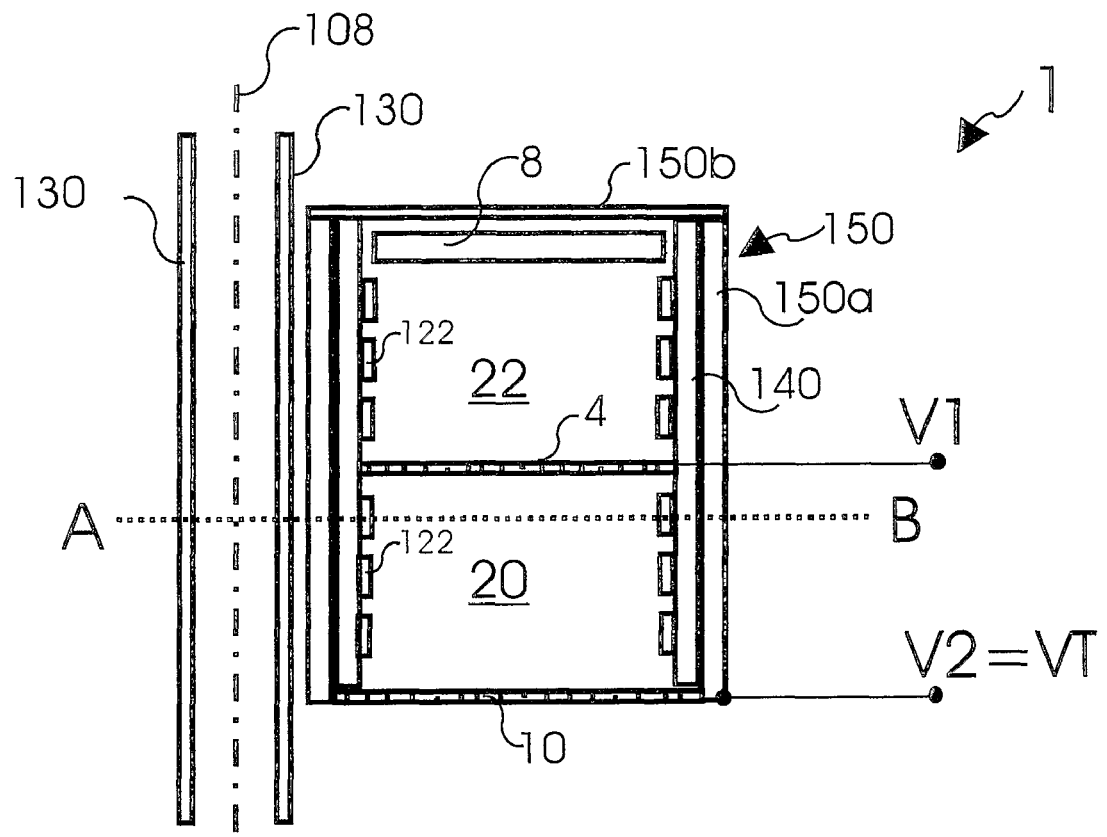
FIG. 12a and FIG. 12b schematically show a sixth embodiment of a retarding field analyzer according to the invention with the retarding field analyzer not surrounding the beam tube element, for use in an electron beam microscope.
Figure 12B:
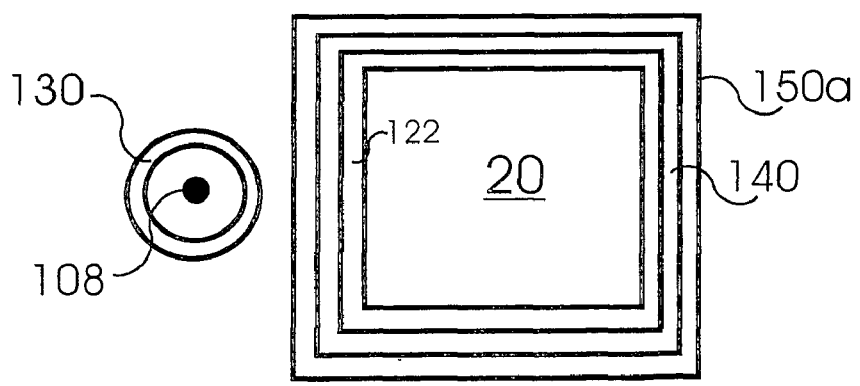

FIG. 12*a* and FIG. 12*b* show a further embodiment of the invention. In the case of FIGS. 12*a* and 12*b*, the retarding field analyzer 1 is not rotationally symmetrical to the optical axis 108 and/or the beam tube element 130. Rather, the retarding field analyzer 1 is arranged in the vicinity of the beam tube element 130. The further beam tube structure 150 comprises an entrance grid electrode 10, a first further beam tube structure element 150*a* (outer shield) and a second further beam tube structure element 150*b* (detector shield) which all have the same tube voltage VT of the beam tube element 130 to completely shield the filter grid electrode 4 and the further electrode elements 122 from external electric fields and, vice versa, to shield the surroundings of the retarding field analyzer from the fields of the retarding electric field region 20. The further electrode elements 122, like in the previous examples, are provided with voltages necessary to reduce the stray field region 41 near the outer shield 150*a*.

Again, the voltages for the further ring electrodes 122 are provided by means of a voltage divider (not shown) or by individual voltage supplies providing individual third voltages V3 to the further ring electrodes between the entrance grid electrode 10 and the filter grid electrode 4, and individual fourth voltages V4 to the further ring electrodes between the filter grid electrode 4 and the charged particle detector. However, it is also possible to provide the same first voltage V1 to the ring electrodes as shown in FIG. 6.

FIG. 12*b* illustrates the cross section of the retarding field analyzer 1 of FIG. 12*a* in the retarding electric field region 20 in a plane normal to the optical axis 108. In this embodiment, cross sections of the outer shield 150*a*, the insulating structure 140, and further electrode elements 122 are a square. However, any other shape is possible as well.

A retarding field analyzer design like in FIGS. 12*a*, 12*b* is useful when the beam of the secondary charged particles 105 is deflected off the optical axis 108 to separate the primary charged particle beam from the secondary charged particle beam. This way, the retarding field analyzer 1 can be positioned into the beam of the secondary charged particles without having to consider the axial symmetry of the beam tube element 130. A retarding field analyzer design like in FIGS. 12*a*, 12*b* may also be used for charged particle beam devices where several types of detectors are to be placed next to the optical axis 108 in order to detect the secondary charged particles with different detectors at the same time.

FIG. 12*b* shows a cross section of the retarding field analyzer 1 in a plane normal to the optical axis 108. In this case, the cross section of the retarding field analyzer section is rectangular, i.e. the at least one further electrode elements 122, the insulating structure 140 and the outer shield 150*a* have a rectangular shape. However, it is also possible for the retarding field analyzer to have a circular cross section.

Figure 13A:
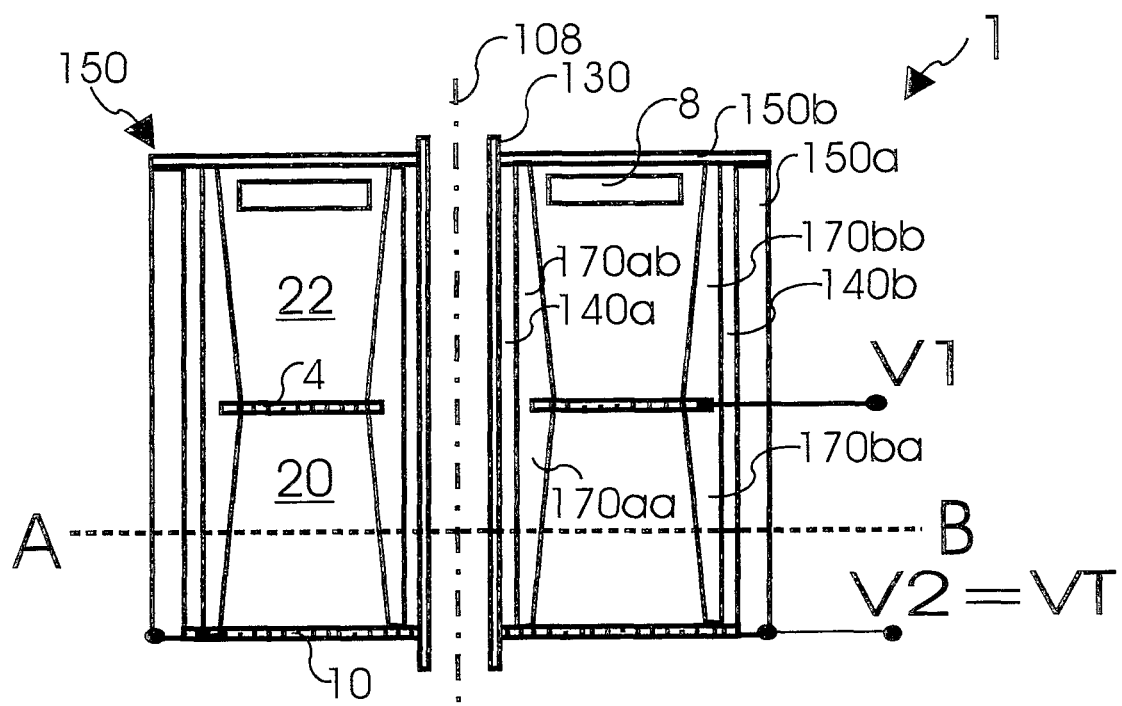
FIG. 13a and FIG. 13b schematically show a seventh embodiment of a retarding field analyzer according to the invention with high-ohmic electrodes that vary in their thickness along the optical axis, for use in an electron beam microscope.
Figure 13B:
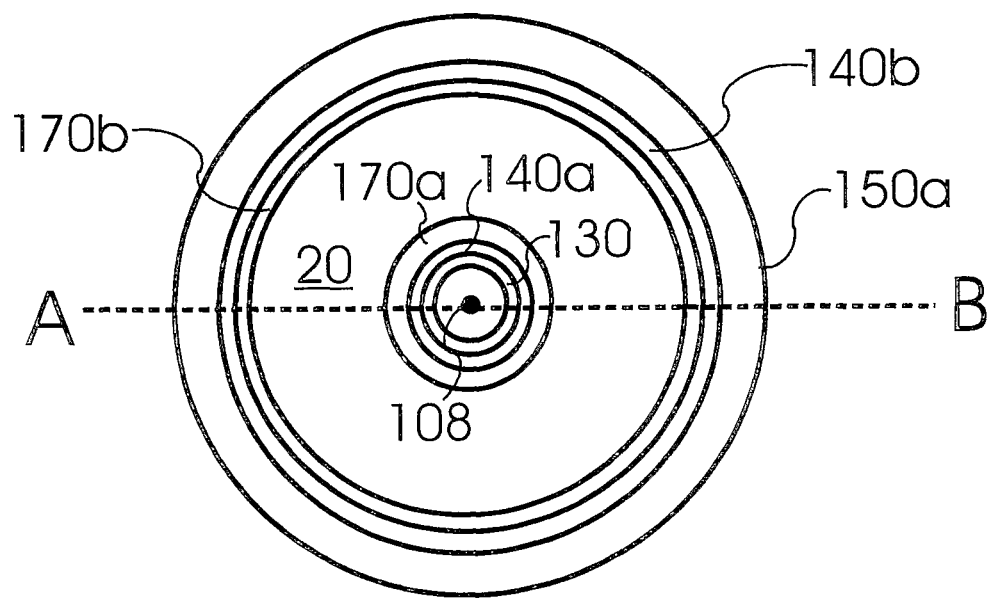

FIG. 13*a* and FIG. 13*b* show a further embodiment of the invention which is similar to the one in FIG. 8. Like in FIG. 8, the further electrode elements are high-ohmic electrodes 170*a*, 170*b* made of material with a resistivity like in FIG. 8. Each high-ohmic electrode 170*a*, 170*b* is directly connected with the entrance grid electrode 10 and filter grid electrode 4 and the detector shield 150*b* in order to provide a current flowing from the entrance grid electrode 10 to the filter grid electrode 4, and a current from the detector shield 150*b* to the filter grid electrode 4. In addition, both high-ohmic electrodes 170*a*, 170*b* have a cylindrical shape; however, the shapes of the further electrode elements are different from FIG. 8 in that the thickness of the inner and outer cylinder jackets vary along the direction of the optical axis 108. The smaller the thickness the larger the ohmic resistance is and, as a consequence, the larger the voltage drop is between two equidistant positions when a current is flowing. This way, shaping the high-ohmic cylinder jackets 170*a*, 170*b* can be used to generate a voltage along the surface of the high-ohmic electrodes 170*a*, 170*b* to minimize the stray fields regions 41. Calculations of the electrostatic fields with various boundary conditions indicate that the stray fields regions 41 in the retarding electric field region 20 and the accelerating electric field 22 become smaller when the thickness of the high-ohmic cylinder jackets 170*a* and 170*b* decreases the further away the position is from the filter grid electrode 4. Further details about how the shape of high-ohmic cylinders influences the potentials on the cylinder surfaces and the according electric fields within the high-ohmic cylinders can be taken from the patent documents EP 0 843 335 A1, U.S. Pat. No. 4,126,781 A1 or U.S. Pat. No. 4,704,532 A1.

Figure 14A:
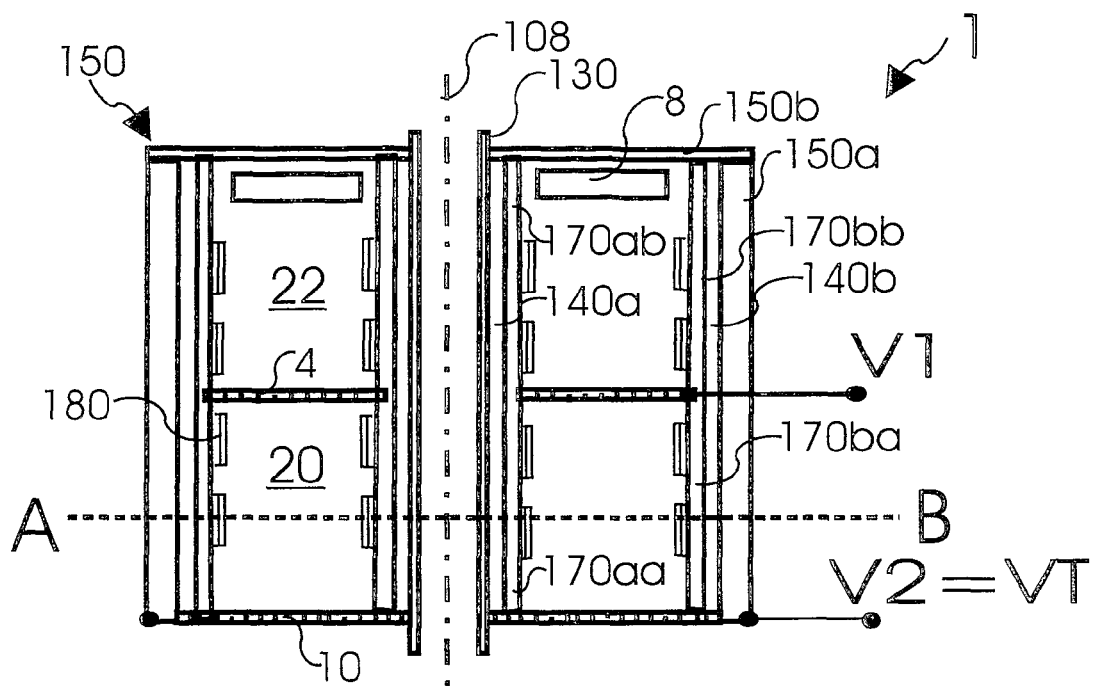
FIG. 14a and FIG. 14b schematically show an eighth embodiment of a retarding field analyzer according to the invention with high-ohmic electrodes combined with insulated ring electrodes, for use in an electron beam microscope.
Figure 14B:
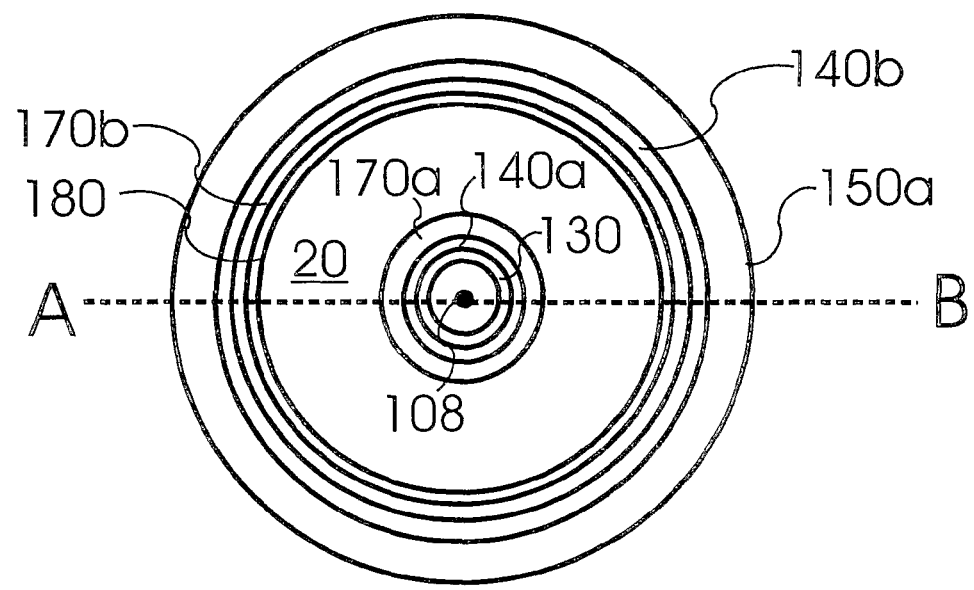

FIG. 14*a* and FIG. 14*b* show another embodiment of the invention where further electrode elements of high ohmic material are combined with those made of conducting material. Again, like in FIG. 8, the lower inner high-ohmic electrode 170*aa* between the entrance grid electrode 10 and the filter grid electrode 4 and the upper inner high-ohmic electrode 170*ab* between the filter grid electrode 4 and the detector shield 150*b* are formed as one cylindrically shaped jacket which is referred to as the inner high-ohmic cylinder 170*a*. Analogously, the lower outer high-ohmic electrode 170*ba* between the entrance grid electrode 10 and the filter grid electrode 4 and the upper outer high-ohmic electrode 170*bb* between the filter grid electrode 4 and the detector shield 150*b* together are formed as another cylindrically shaped jacket which is referred to as the outer high-ohmic cylinder 170*b*. Further, the inner high-ohmic cylinder 170*a* and the outer high-ohmic cylinder 170*b* are each in direct electrical contact with the filter grid electrode 4, the entrance grid electrode 10 and the detector shield 150*b*. This way, a current can flow from the entrance grid electrode 10 having a tube voltage VT to the filter grid electrode 4 having a first voltage V1, and from the detector shield 150*b* having the same tube voltage VT to the filter grid electrode 4. Again, the cylindrical inner insulating structure 140*a* between the beam tube element 130 and the inner high-ohmic cylinder 170*a* prevents an electrical current from flowing radially between the high-ohmic cylinders 170*a,b* and the beam tube element 130. The same holds true for the outer insulating structure 140*b* between the outer shield 150*a* and the outer high-ohmic cylinder 170*b*.

As for the retarding field analyzer 1 of FIG. 8, due to Ohm's law, the electric potentials on the surface of the inner and outer high-ohmic cylinders 170*a*, 170*b* increase or decrease continuously in the direction of the optical axis 108 when a second voltage V2 is applied to the entrance grid electrode 10 and a first voltage V1 to the filter grid electrode. The continuous increase or decrease of the voltages on the high-ohmic cylinders 170*a*, 170*b* significantly reduces the stray field regions 41*a* and 41*b* within the retarding electric field region 20 and accelerating electric field region 22. However, for a further reduction of the stray field regions 41*a* and 41*b*, discrete insulated ring electrodes 180 are attached to the outer surface of the inner high-ohmic cylinder 170*a* and to the inner surface of the outer high-ohmic cylinder 170*b*.

The term "insulated ring electrode" refers to the fact that the ring electrodes are attached in a way that they are electrically insulated from the inner or outer high-ohmic cylinders 170a or 170b. The insulation between the insulated ring electrodes 180 and the high-ohmic cylinders 170a, 170b is indicated in FIG. 14a by the two strip-like structures of each insulated ring electrode 180. The insulation between the insulated ring electrodes 180 and the high-ohmic cylinders 170a, 170b allows the voltages of the insulated ring electrodes to be adjusted independently from the voltages on the high-ohmic cylinders. This way, the voltages of the insulated ring electrodes 180 can be adjusted independently to further minimize the sizes of the stray field regions 41a, 41b, compared to the sizes of the stray field regions 41a, 41b as shown in FIG. 8.

FIG. 14b illustrates a cross section of the retarding field analyzer 1 of FIG. 14b in the retarding electric field region 20 in a plane normal to the optical axis 108. As before, the inner insulating structure 140a, the inner high-ohmic cylinder 170a, the inner insulated ring electrodes, the outer insulated ring electrodes, the outer high-ohmic cylinder 170b, the outer insulating structure 140b and the outer shield 150a are essentially coaxial with the optical axis 108 and the beam tube element 130.

Figure 15A:
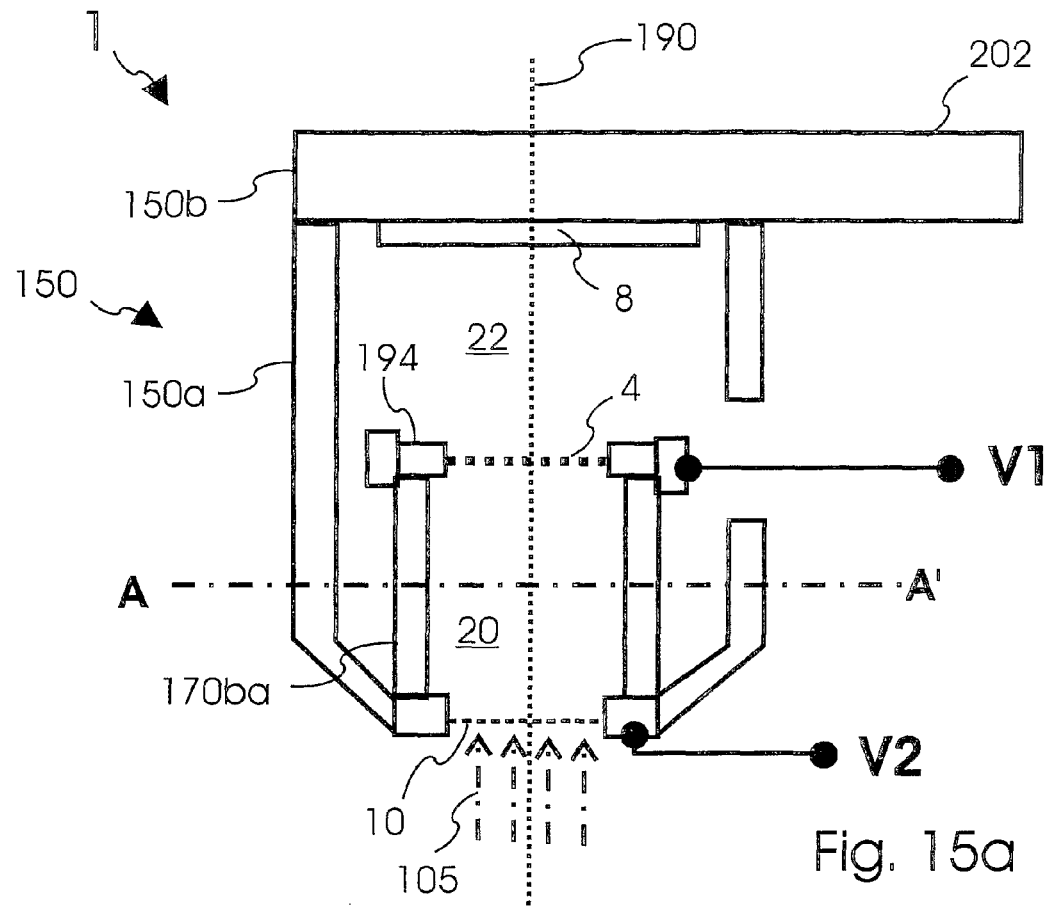
FIG. 15a and FIG. 15b schematically show cross sections of a ninth embodiment of a retarding field analyzer according to the invention, which can be operated at a position which is asymmetric with respect to the optical axis, and having high-ohmic electrodes for the retarding electric field region only.
Figure 15B:
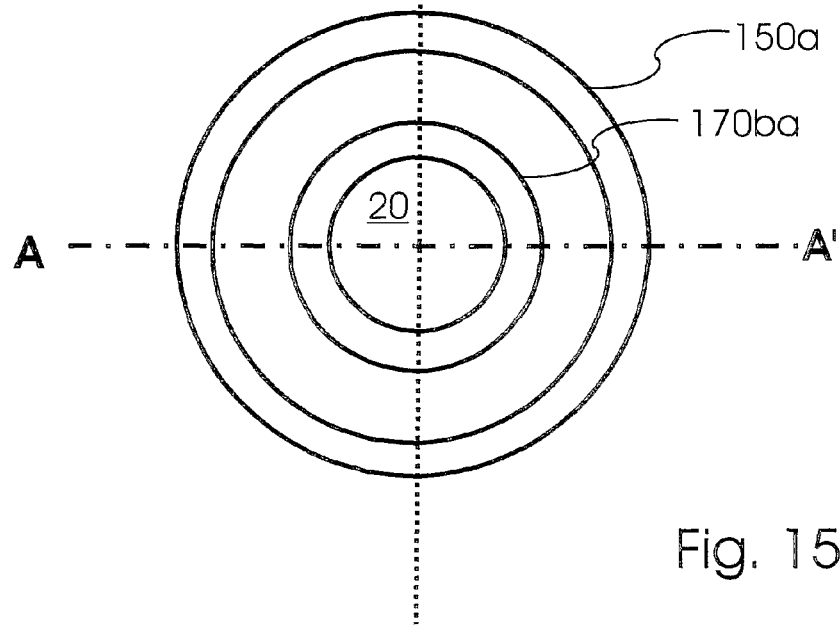

FIGS. 15a-b schematically show two orthogonal cross sectional views along lines A-A' of another retarding field analyzer according to the invention.

Retarding field analyzer 1 of FIGS. 15a-b discloses a circular filter grid electrode 4 electrically connected to a first voltage V1 via circular filter grid holding means 194, and circular shaped entrance grid electrode 10 connected to second voltage V2. Entrance grid electrode 10 and filter grid electrode 4 are coaxially aligned with respect to symmetry axis 190 to define a coaxial circular retarding electric field region 20 between filter grid electrode 4 and entrance grid electrode 10. In the case of FIGS. 15a-b, grid holding means 194 is a ring-shaped structure for holding filter grid electrode 4 in place, for providing an electrical contact between outer high-ohmic electrode 170ba and filter grid electrode 4, and for providing an electrical contact between first voltage and filter grid electrode 4.

FIGS. 15a-b further disclose cylindrically shaped lower outer high-ohmic electrode 170ba surrounding retarding electric field region 20 between filter grid electrode 4 and entrance grid electrode 10 to reduce the size of outer stray field region 41b (see FIG. 8) for improving the homogeneity within retarding electric field region 20, and charged particle detector 8 to detect the charged particles 105 that have passed through entrance grid electrode 10 and filter grid electrode 4. With lower outer high-ohmic electrode 170ba in direct electrical contact with entrance grid electrode 10 and filter grid electrode 4, a homogenously distributed current can flow between circular entrance grid electrode 10 and circular filter grid electrode 4 once first voltage V1 and second voltage V2 are applied. Further, it is preferred that the two circular front side faces of cylindrically shaped lower outer high-ohmic electrode 170ba are in direct mechanical contact with respective entrance grid electrode 10 and/or filter grid electrode 4 so that an electrical contact is provided all along the circular front side faces. This way, a homogenous current density is provided in azimuthal direction of lower outer high-ohmic electrode 170ba. Further, this way, lower outer high-ohmic electrode 170ba fully covers retarding electric field region 20 between entrance grid electrode 10 and filter grid electrode for improving electric field homogeneity.

In the case of FIGS. 15a-b, lower outer high-ohmic electrode 170ba is formed as a cylindrical jacket (or tube or cylindrical hollow shaft) whose wall has a thickness of at least 100 µm, and preferably of at least 500 µm. This way, lower outer high-ohmic electrode 170ba is a self-supporting structure. Further, with a sufficiently thick jacket wall, lower outer high-ohmic electrode 170ba is rigid enough to hold filter grid electrode 4 and entrance grid electrode 10 precisely in place with respect to each other, and to withstand traction caused, for example, by cabling connecting filter grid electrode 4 with first voltage V1. Further, with a thick jacket wall, it is possible to control the homogeneity of the resistance of the jacket to a high degree in order to improve the field homogeneity of the retarding electric field region 20.

In the present case, cylindrical jacket 170ba has an inner diameter of 9 mm, a wall thickness of 1 mm, and an axial length of 11 mm. The material of the cylindrical jacket is based on aluminum oxide; however, the material may be any other material that has a sufficiently high resistivity (typically $10^{11}$ Ωcm), e.g. Murflor, or a mixture of ceramics, preferably based on tin oxide, zirconium oxide, aluminum nitride, titanium nitride, or an epoxy resin based material. The high resistivity is needed to reduce the current flowing between entrance grid electrode 10 and filter grid electrode 4. A too high current would overheat the lower outer high-ohmic electrode 170ba and cause problems like mechanical stress, self-destruction, and the like. Generally, it is tried to keep the current between entrance grid electrode 10 and filter grid electrode 4 during normal operation below 1 µA by choosing resistivity of the material, wall thickness, and inner diameter of the lower outer high-ohmic electrode 170ba accordingly.

FIGS. 15a-b further discloses an electrically conducting housing 150 that encloses filter grid electrode 4, lower outer high-ohmic electrode 170ba, and charged particle detector 8. In FIG. 15a-b, electrically conducting housing 150 consists of entrance grid electrode 10, outer shield 150a and detector shield 150b, each good conductors, which are short-circuited with each other to have a common housing voltage VH given by the second voltage V2 of entrance grid electrode 10. In other words, VH=V2. Further, outer shield 10 provides electric shielding essentially in a lateral direction with respect to the incoming charged particles 105, entrance grid electrode 10 provides shielding essentially in a direction opposite to the incoming charged particles 105, and detector shield 150b provide shielding essentially in the direction of the incoming charged particles.

The electrical shielding of electrically shielding housing 150 is quite efficient since it has only two openings, i.e. the one opening of entrance grid electrode 10 and one opening to feed second voltage V1 to filter grid electrode 4. While the two openings in the present case have about the same size, this is not a necessity. In the present case, electrically shielding housing 150 covers more than 90% of the total solid angle when seen from center of the filter grid electrode 4 to efficiently shield the surrounding of the retarding field analyzer 1.

By adjusting the housing voltage VH, or second voltage V2, it is possible to minimize interference the retarding field analyzer 1 with the region outside of the housing. For example, if retarding field analyzer 1 is used in the vicinity of primary charged particle beam 104 of a charged particle beam device, housing voltage VH (or V2) can be adjusted to minimize electrical interference of the retarding field analyzer 1 on the primary charged particle beam. In particular, if primary charged particle beam 104 is transported through a beam tube element 130 in order to have an energy defined by the voltage of the beam tube element (i.e. tube voltage VT), it is possible to minimize interference of retarding field analyzer 1 with said primary charged particle beam 104 by applying the tube voltage VT to the electrical shielding housing 150. In this case, VH=V2=VT. Further, in this case, the electrically shielding housing 150 may be mechanically connected with the beam tube element 130. In this case, electrically shielding housing 150 is also referred to as further beam tube structure 150, as shown in FIG. 5.

Further, in FIGS. 15a-b, electrically shielding housing 150 provides the voltage for accelerating the charged particles that have passed filter grid electrode 4 towards particle detector 8. In this case, the electrical field of retarding electric field region 22 is essentially defined by first voltage V1 connected to filter grid electrode 4 and housing voltage VH (or second voltage V2). If charged particle detector 8, for example, is a scintillator, no additional voltage is required to accelerate the charged particles towards charged particle detector 8.

In FIG. 15a-b, like in FIGS. 6, 7 and 8, the charged particle detector 8 is preferably a scintillator 8 having a planar entrance window for the incoming charged particles. On the other hand, the charged particle detector 8 may be segmented, e.g. by use of a segmented scintillator or by use of segmented detectors like a micro-channel plate or CCD. Further, in FIGS. 15a-b, entrance grid electrode 10 is shown as a grid having only one opening. In this case, entrance grid electrode 10 may look like a circular ring or a square. One opening has the advantage that it provides for a maximum transparency since there is no absorbing structure within the opening. However, on the other hand, the quality of the homogeneity of the retarding electric field region may suffer if the one opening is too large. Therefore, the optimum number of openings for an entrance grid electrode 10 depends on the balance between transparency and homogeneity of retarding electric field region 20 that is best for a given distribution of incoming charged particles 105. Accordingly, the retarding field analyzers of FIG. 15a-b to 19a-b may equally have one or multiple openings.

Figure 16A:
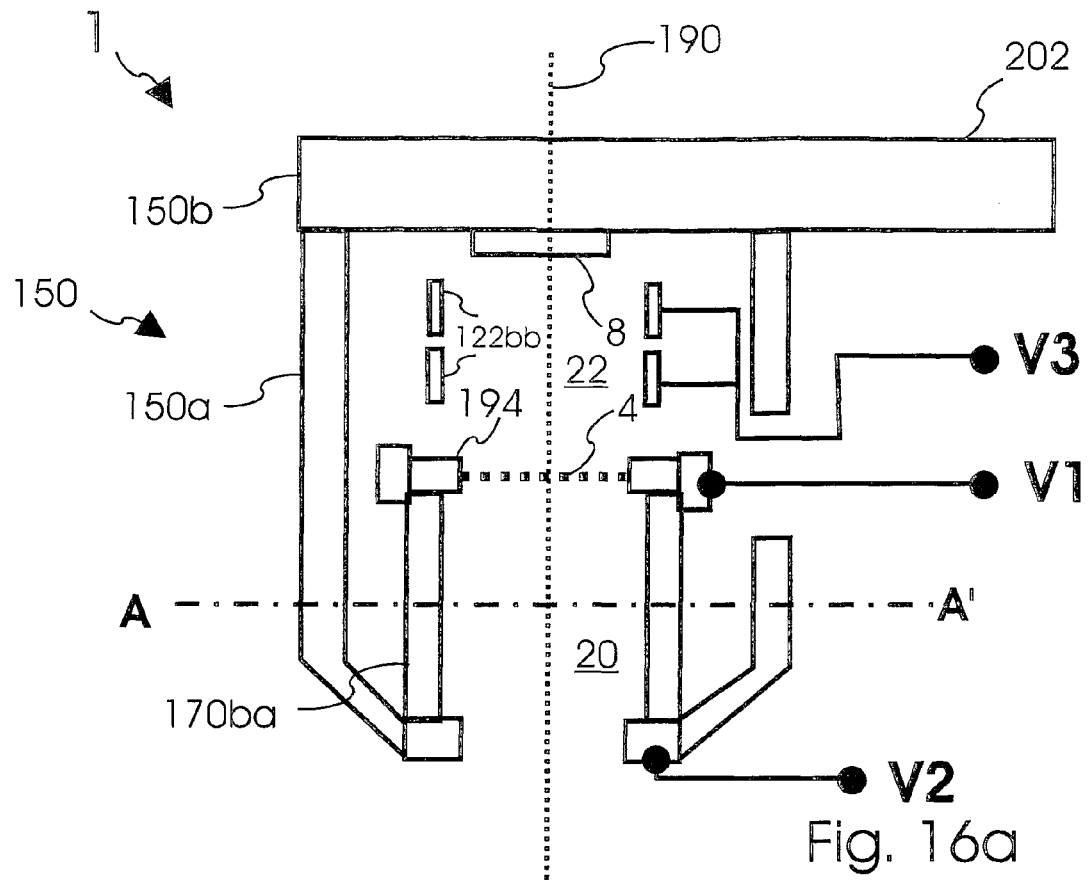
FIG. 16a and FIG. 16b schematically show cross sections of a tenth embodiment of a retarding field analyzer according to the invention, which can be operated at a position which is asymmetric with respect to the optical axis, and having high-ohmic electrodes for the retarding electric field region only, and ring electrodes for the accelerating electric field region.
Figure 16B:
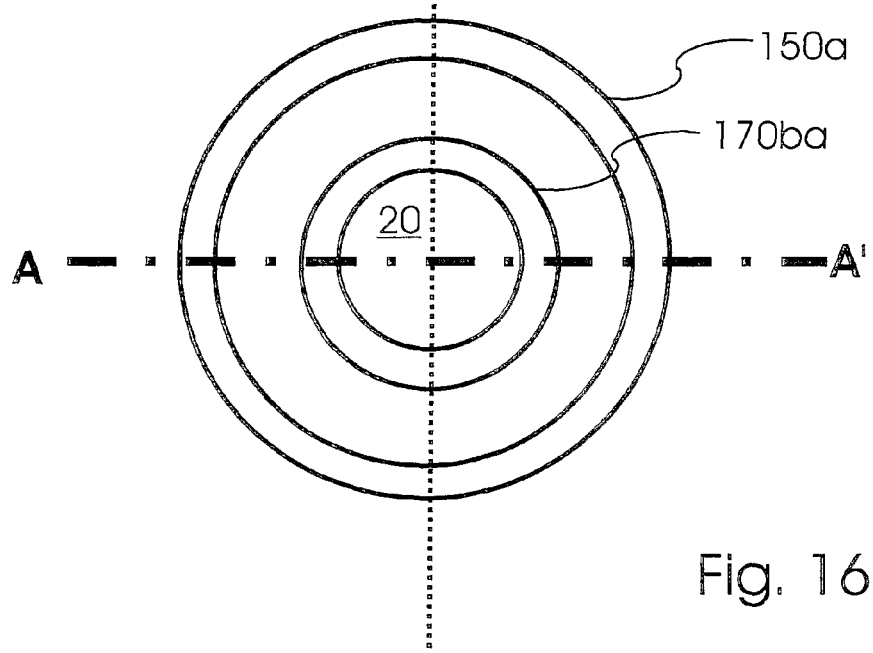

FIGS. 16a-b schematically show two orthogonal cross sectional views along lines A-A' of a further retarding field analyzer according to the invention that equals the retarding field analyzer 1 of FIGS. 15a-b except that it has in addition two upper outer further electrode elements 122bb (ring electrodes) to reduce the size of outer stray fields within accelerating electric field region 22 between charged particle detector 8 and filter grid electrode 4. In the present case, the voltages of the two ring electrodes 122bb are the same, and are controlled by a voltage source providing a third voltage V3.

The upper and lower ring electrodes 122bb with their respective voltage help homogenizing the accelerating electric field region 22. By homogenizing the accelerating electric field region, charged particles that have passed through filter grid electrode 4 can be prevented from becoming deflected away from the charged particle detector 8. Accordingly, the charged particle detector 8 can have a smaller size without missing any of the charged particles. A smaller detecting region may simplify the design of the charged particle detector 8 and reduce costs. Further, in the case that the charged particle detector 8 is an charge sensitive detector, like a pin-diode, the reduced size of the detector leads to a reduced detector capacitance which in turn reduces signal noise level and improves the counting rate capability.

Figure 17A:
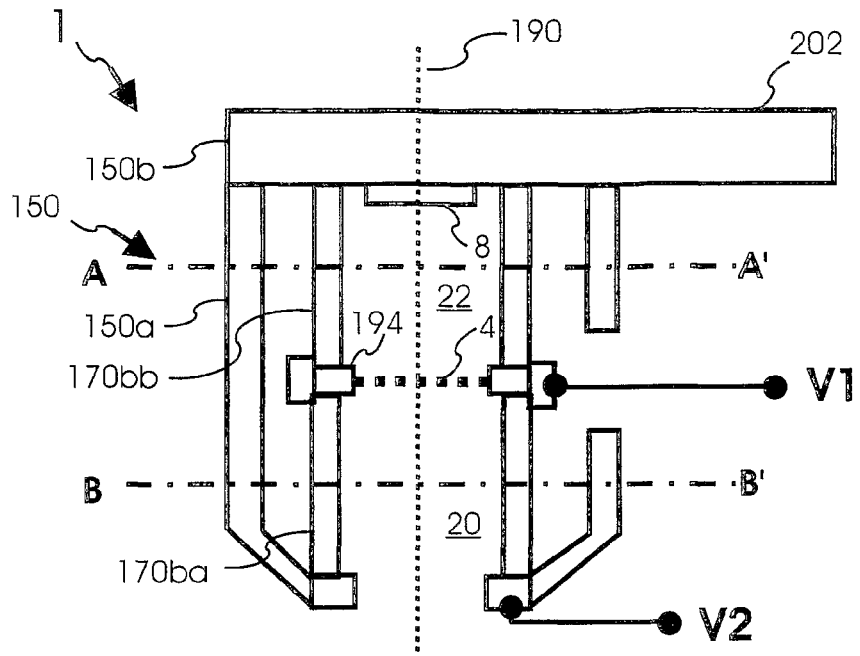
FIG. 17a, FIG. 17b and FIG. 17c schematically show cross sections of an eleventh embodiment of a retarding field analyzer according to the invention, which can be operated at a position which is asymmetric with respect to the optical axis, and having high-ohmic electrodes for the retarding electric field region and the accelerating electric field region.
Figure 17B:
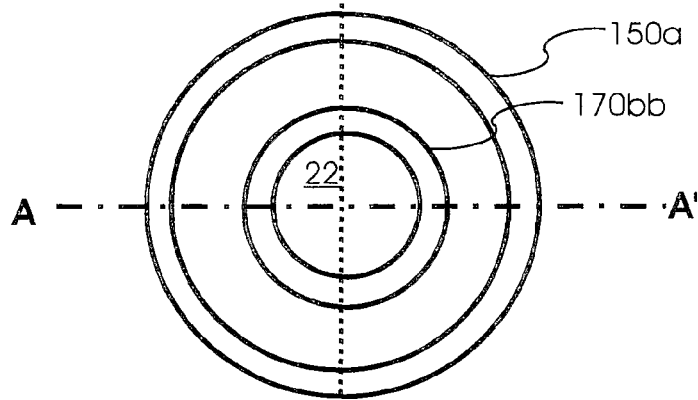
Figure 17C:
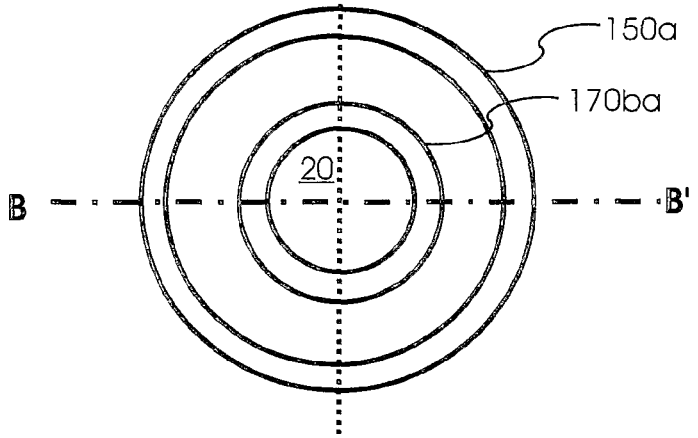

FIGS. 17a-b schematically show two orthogonal cross sectional views along lines A-A' of a further retarding field analyzer according to the invention. The retarding field analyzer 1 of FIGS. 17a-b equals the retarding field analyzer 1 of FIGS. 16a-b except that the two ring electrodes 122bb of FIG. 16a are replaced by upper outer high-ohmic electrode 170bb. Upper outer high-ohmic electrode 170bb is electrically connected with detector shield 150b and with filter grid electrode 4 to provide a high-ohmic resistance between the two. This way, like lower outer high-ohmic electrode 170ba for retarding electric field region 20, upper outer high-ohmic electrode can be used to reduce the size of the outer stray field regions of accelerating electric field region 22. This helps homogenizing the accelerating electric field region 22 which in turn prevents charged particles that have passed filter grid electrode 4 from becoming deflected away from charged particle detector 8.

Preferably, properties of material, geometry and resistance of upper outer high-ohmic electrode 170bb can be any of those that have been described for lower outer high-ohmic electrode 170bb. In particular, it is preferred that material, geometry and/or resistance of upper outer high-ohmic electrode 17bb are the same as for lower outer high-ohmic electrode 170ba to simplify the design and improve mechanical rigidity of the retarding field analyzer 1. In FIGS. 17a-b, lower outer high-ohmic electrode 170ba and upper outer high-ohmic electrode 170bb are formed as identical cylindrical jackets that are coaxially aligned with respect to each other.

Figure 18A:
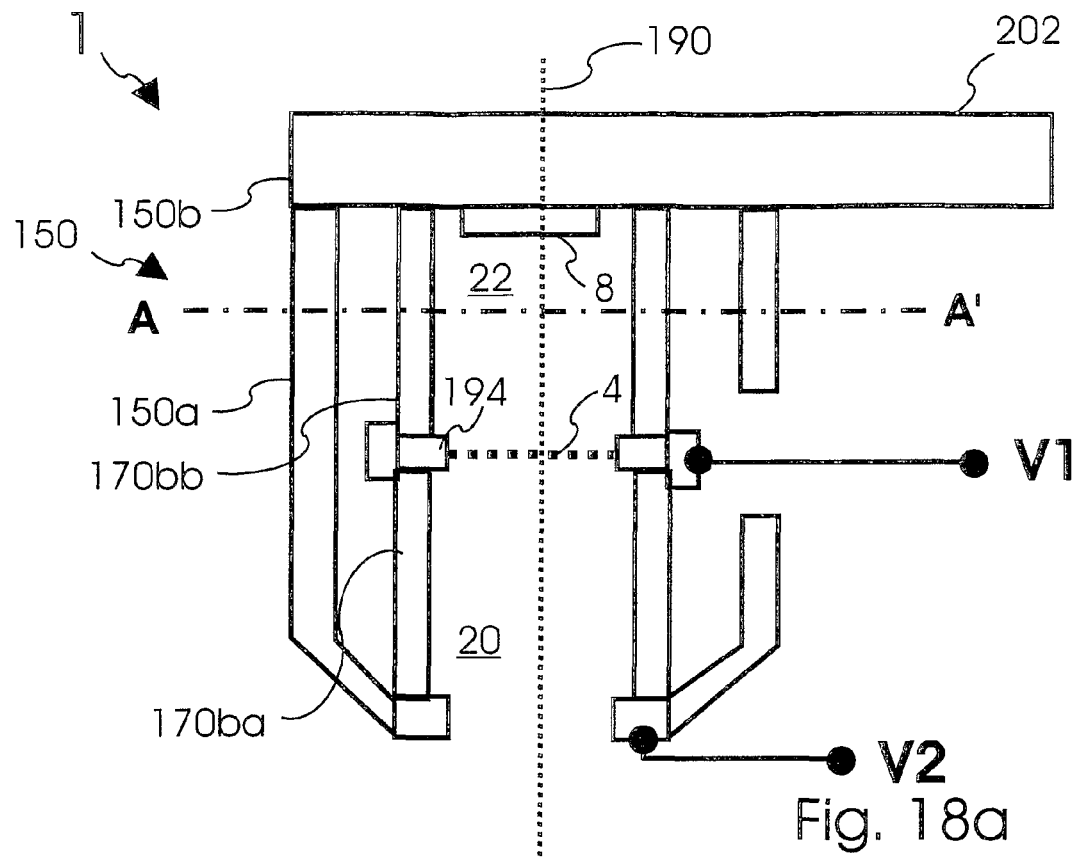
FIG. 18a and FIG. 18b schematically show cross sections of a twelfth embodiment of a retarding field analyzer according to the invention, which can be operated at a position which is asymmetric with respect to the optical axis, and having high-ohmic electrodes for the retarding electric field region and the accelerating electric field region, whereby the high-ohmic electrodes of the accelerating electric field region have a squared cross section.
Figure 18B:
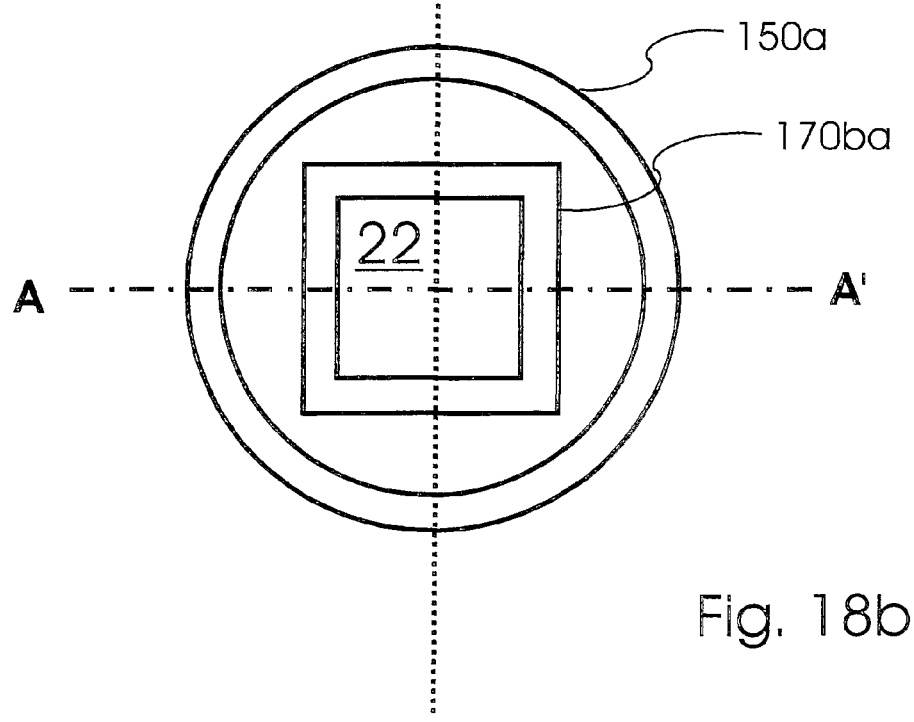

FIGS. 18a-b schematically show two orthogonal cross sectional views along lines A-A' of a further retarding field analyzer according to the invention. The retarding field analyzer 1 of FIGS. 18a-b equals the retarding field analyzer 1 of FIGS. 17a-b except that the upper outer high-ohmic electrode 170bb is formed as a jacket having a squared cross section in a plane orthogonal with respect to symmetry axis 190. A squared cross section induces distortions into the accelerating electric field region 22 that can be used to direct the charged particles into particular regions of the charged particle detector 8. This in turn can be used to identify at the same energy and space of the incoming charged particles 105.

FIGS. 19a-b schematically show two orthogonal cross sectional views along lines A-A' of a further retarding field analyzer according to the invention. The retarding field analyzer 1 of FIGS. 19a-b equals the retarding field analyzer 1 of FIGS. 17a-b except that the thickness of the wall of upper outer high-ohmic electrode 170bb narrows in axial direction from filter grid electrode 4 to charged particle detector 8. For example, the thickness of the wall of the upper outer high-ohmic electrode 170bb at the detector end may be half of the thickness of the wall at the filter grid electrode end. This thickness variation introduces a focusing accelerating electric field region 22. With the focusing, it is possible to use a small charged particle detector 8 without missing any of the charged particles. The small required detector size facilitates the use of a charged particle detector 8, e.g. a PIN-diode, that has a small detector capacity which in turn increases detection speed and signal to noise ratio. It should be mentioned that, while the wall thickens varies along the axial direction, the rotational symmetry of upper outer high-ohmic electrode 170bb with respect to symmetry axis remains.

It should be mentioned that not only upper outer high-ohmic electrode 170bb may deviate from a strictly cylindrical shape. For example, it may also prove advantageous to have the shape of the lower outer high-ohmic electrode deviated from a strictly cylindrical shape in order to correct the aperture angle of the incoming charged particles. In this case, by varying the wall thickness of the lower outer high-ohmic electrode in axial direction, it is possible that the aperture angle of the incoming charged particles becomes close to zero once the charged particles have entered the retarding electric field region. This, of course, would further increase the spectroscopic capability of the retarding field analyzer 1.

Figure 20:
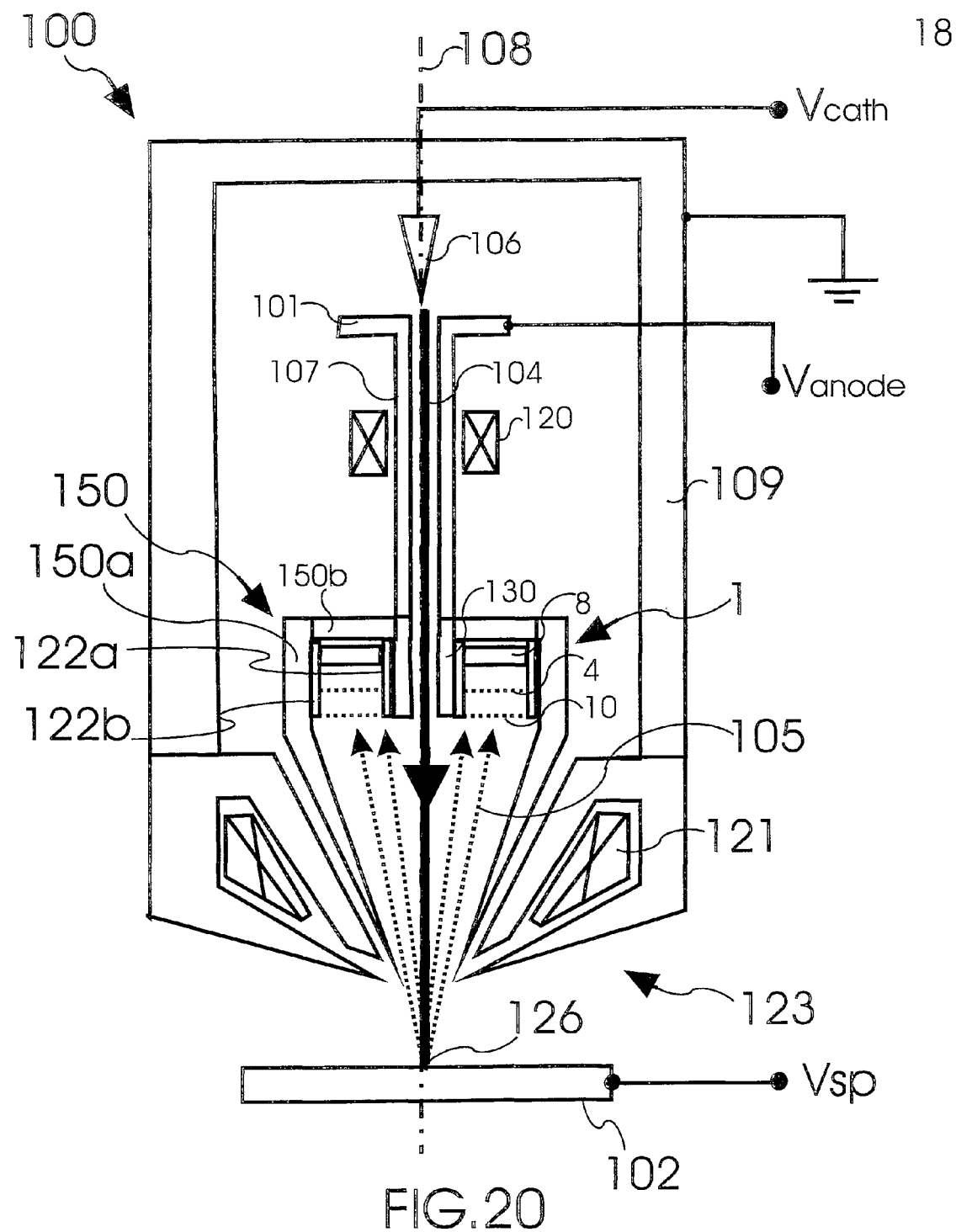
FIG. 20 schematically shows an electron beam microscope according to the invention having a retarding field analyzer for detecting secondary charged particles inside the high voltage beam tube.

FIG. 20 schematically shows the charged particle beam device that has already been described in detail in FIG. 5 with the exception that further beam tube structure 150 has been separated from high voltage beam tube 107, as indicated by the two lines separating the two.

Figure 21:
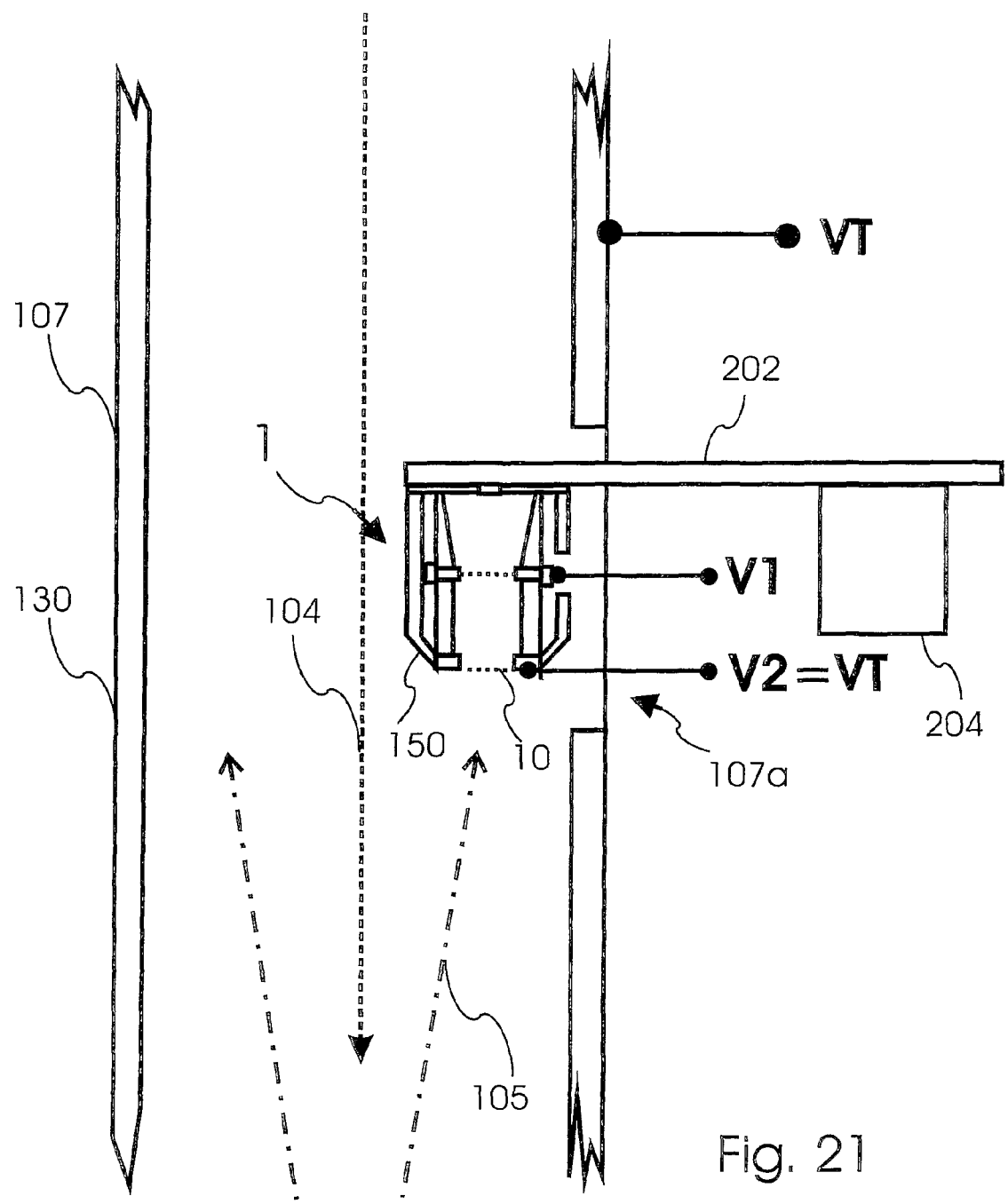
FIG. 21 schematically shows a cross section of a beam tube element of a charged particle beam device according to the invention, the wall of the beam tube element having a beam tube opening for receiving a retarding field analyzer.
Figure 22:
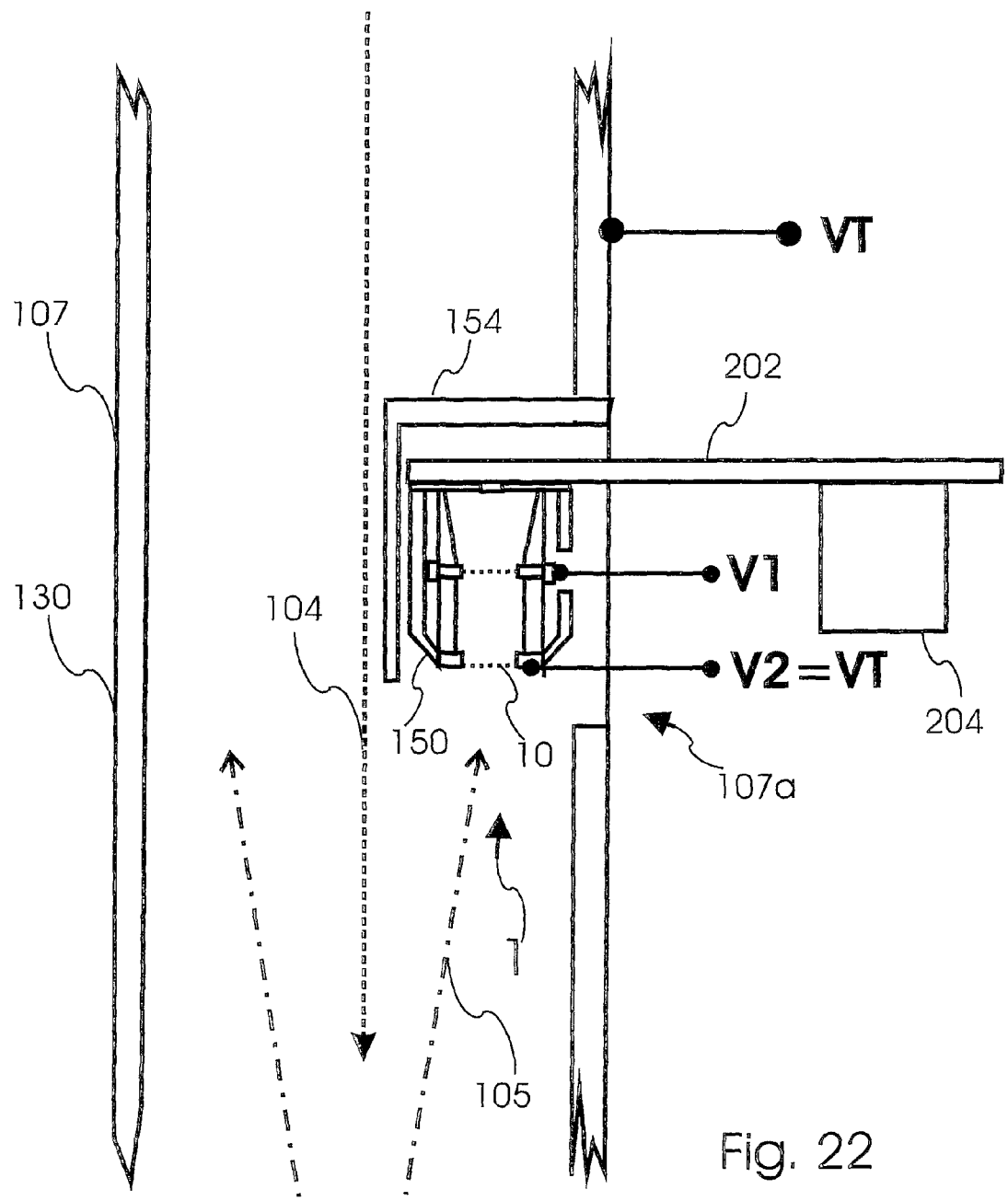
FIG. 22 schematically shows a cross section of a beam tube element of a charged particle beam device according to the invention, the wall of the beam tube element having a beam tube opening for receiving a retarding field analyzer, and a second detector shield.
Figure 23:
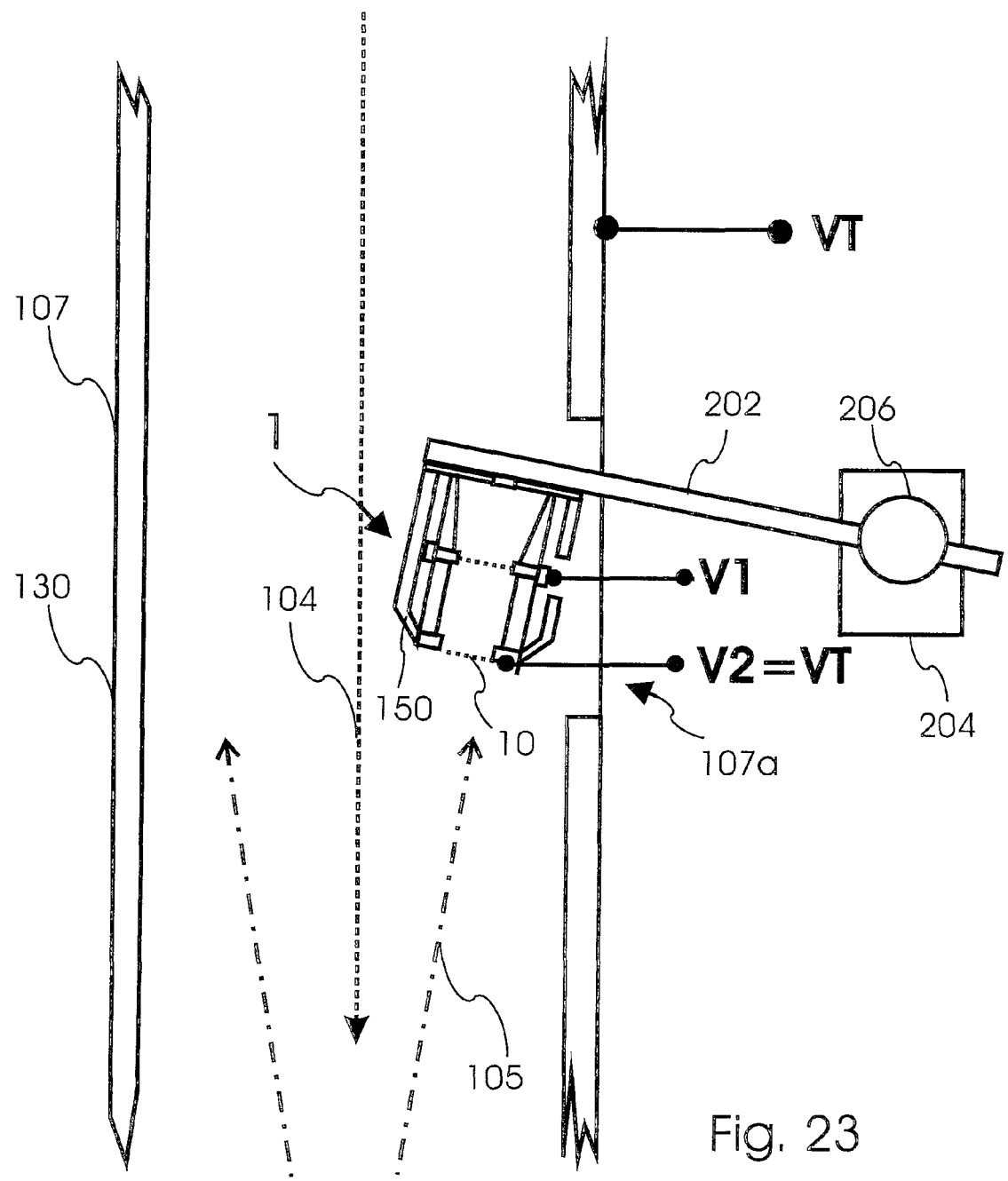
FIG. 23 schematically shows a cross section of a beam tube element of a charged particle beam device according to the invention, the wall of the beam tube element having a beam tube opening for receiving a retarding field analyzer 1, as well as moving means and rotation means for rotating retarding field analyzer 1 within beam tube element.

FIGS. 21-23 show different setups where retarding field analyzers 1 according to the invention are mounted such that they can be moved in and out of high voltage beam tube 107 to carry out high precision spectroscopic measurements on secondary charged particles 105 that travel within high voltage beam tube 107, i.e. in a direction that is almost opposite to the direction of the primary charged particle beam 104. It should be mentioned that charged particle beam devices 100 of the type as shown in FIG. 20 may contain one or several of the above movable retarding field analyzers in order to collect complementary information on a specimen under inspection.

FIG. 21 exemplarily shows a schematic cross section through a section of high voltage beam tube 107 of a charged particle beam device, e.g. the electron beam microscope, or scanning electron microscope of FIG. 5, with high voltage beam tube 107 surrounding primary charged particle beam 104 for accelerating the primary charged particle beam to an energy defined by tube voltage VT. Primary charged particle beam 104 is scanned over a specimen (not shown) in order to produce secondary charged particles 104, e.g. backscattered electrons, that carry a signature of the specimen structure. In order to detect the secondary charged particles close to the primary charged particle beam 104, the wall of high voltage beam tube 107 has a beam tube opening 107a for receiving retarding field analyzer 1. Retarding field analyzer 1 can be any of the retarding field analyzers 1 that have been described in the FIGS. 15a-b to 19a-b. In the present case, retarding field analyzer 1 corresponds to the retarding field analyzer 1 of FIGS. 19a-b.

The electrical interference between primary charged particle beam 104 and retarding field analyzer 1 is minimized by electrically shielding housing 150 that surrounds filter grid electrode 4, lower outer high-ohmic electrode 170ba, upper outer high-ohmic electrode 170bb and charged particle beam device 8 (see FIGS. 19a-b) and which is kept at a second voltage V2 that equals tube voltage VT of high voltage beam tube 107 (V2=VT). With the electrically shielding housing 150 having a voltage that equals tube voltage VT, primary charged particle beam 104 hardly "sees" retarding field analyzer 1 even if the latter is close to primary charged particle beam 104. Accordingly, with the retarding field analyzers 1 according to the invention, it is possible to perform high resolution spectroscopy with secondary charged particles 105 that pass by very closely to primary charged particle beam 104. This property may be particular important for focusing charged particle beam devices where the secondary charged particles enter the retarding field analyzer 1 through the focusing lens (in-lens detector).

FIG. 21 further discloses moving means 204 for moving retarding field analyzer 1 repeatedly towards or away from high voltage beam tube 107 (or beam tube element 130). Moving means 204 can be a stepping motor or any other motor that is capable of moving retarding field analyzer 1 by a few millimeters forth and back with high precision. In FIG. 21, moving lever 202 mechanically connects retarding field analyzer 1 with moving means 204. Accordingly, by moving lever 202 forth and back by moving means 204, retarding field analyzer 1 can be moved towards or away from high voltage beam tube 107. Moving retarding field analyzer 1 with respect to beam tube element 130 may be necessary for an alignment of the primary charged particle beam (104), or for an adjustment to incoming secondary charged particles 105.

FIG. 22 shows a schematic cross section through high voltage beam tube 107 (or beam tube element 130) that is identical to high voltage beam tube 107 of FIG. 21 except that inside of high voltage beam tube 107, beam tube opening 107a is partially covered by second detector shield 154. For a better shielding, second detector shield 154 is made of an electrically conducting material. Further, second detector shield 154 is shaped and positioned to provide for shielding of primary charged particle beam 104 against interferences with retarding field analyzer 1 when entering high voltage beam tube 107 through beam tube opening 107a. Preferably, second detector shield 154 is shaped and positioned to provide for a complete coverage for retarding field analyzer 1 inside high voltage beam tube 107 except for an opening for the secondary charged particles 105 to reach entrance grid electrode 10. With such coverage, primary charged particle beam 104 does not "see" if, for example, moving means 204 make retarding field analyzer 1 change its position and, accordingly, is not disturbed by it.

FIG. 23 shows a schematic cross section through high voltage beam tube 107 that is identical to high voltage beam tube 107 of FIG. 21 except that in addition to moving means 204 rotation means 206. With moving and rotation means 206 have been added to rotate retarding field analyzer 1 within high voltage beam tube 107. This way, it is possible to adjust the angle of retarding field analyzer 1 such that secondary charged particles 105 can pass through entrance grid electrode 10 in normal direction. If secondary charged particles 105 enter retarding electric field region 20 in electric field direction, the spectroscopic performance of the retarding field analyzer is improved.

In the description, so far, the filter grid electrodes have been described as a single grid with one or multiple openings. However, it has been found out that the energy resolution of incoming charged particles can be improved when the filter grid electrode of a retarding field analyzer is replaced by two coplanar filter grid electrodes ("double grid") which preferably are at the same potential and which are close to each other with respect to the distance between entrance grid electrode and filter grid electrode. For example, if the distance between entrance grid electrode and filter grid electrode is 5 mm, the distance between the two filter grid electrodes is in the range of 1 to 2 mm.

In another embodiment, the charged particle beam device according to the invention comprises several beam tube elements which are positioned in parallel to guide several charged particle beams in parallel towards a specimen. Such charged particle beam device is described, e.g. in EP 1 150 327 A1. In this case, it is preferred that the filter grid electrode, the entrance grid electrode and/or at least one of the electrode rings of the retarding field analyzer surround several of the beam tube elements.

The voltage difference between the specimen voltage and the at least one filter grid electrode voltage is preferably smaller than 100V, preferably smaller than 50V and even more preferred smaller than 10 V. The at least one further electrode element is a high-ohmic electrode comprising high-ohmic material with a resistance between $10^7$ $\Omega$cm and $10^{13}$ $\Omega$cm, and preferably between $10^9$ $\Omega$cm and $10^{11}$ $\Omega$cm. The high-ohmic material is Murflor or a mixture of ceramics, preferably based on tin oxide, zirconium oxide, aluminum oxide, aluminum nitride, titanium nitride, or a epoxy resin based material. The at least one further electrode element is formed of a conducting material, preferably a metal. The charged particle beam device (100) is an electron beam microscope, and preferably a scanning electron microscope. The at least one filter grid electrode (4) comprises an array of openings with a pitch smaller than 100 μm and preferably smaller than 60 μm and/or the entrance grid electrode (10)

comprises an array of openings with a pitch smaller than 500 μm and preferably smaller than 200 μm.

At least one of the lower outer high-ohmic electrode (170ba) and the upper outer high-ohmic electrode (170bb) consists of high-ohmic material having a resistivity between $10^7$ Ωcm and $10^{13}$ Ωcm, preferably between $10^8$ Ωcm and $10^{12}$ Ωcm and even more preferred between $10^9$ Ωcm and $10^{11}$ Ωcm. At least one of the lower outer high-ohmic electrode (170ba) and the upper outer high-ohmic electrode (170bb) consists of Murflor or a mixture of ceramics, preferably based on tin oxide, zirconium oxide, aluminum oxide, aluminum nitride, titanium nitride, or a epoxy resin based material. The wall of at least one of the lower outer high-ohmic electrode (170ba) and the upper outer high-ohmic electrode (170bb) has a thickness of at least 100 μm, preferably of at least 250 μm, and even more preferred of at least 500 μm. The resistivity of the material of at least one of the lower outer high-ohmic electrode (170ba) and the upper outer high-ohmic electrode (170bb) varies by less than 20%, preferably by less than 10% and even more preferred by less than 5%. At least one of the lower outer high-ohmic electrode (170ba) and the upper outer high-ohmic electrode (170bb) has an n-fold rotational symmetry with respect a symmetry axis (190) and, preferably, a fully rotational symmetry with respect to said symmetry axis (190).

The electrically shielding housing (150) encloses at least one of the filter grid electrode (4), the charged particle detector (8), the lower outer high-ohmic electrode (170ba), and the upper outer high-ohmic electrode (170bb) to more than 40% of the full solid angle, preferably more than 60% of the full solid angle, and even more preferred more than 90% of the full solid angle as seen from the center of the filter grid electrode (4). The filter grid electrode (4) and entrance grid electrode (10) are positioned with respect to each other to withstand a voltage difference of more than 2000 V, preferably more than 4000 V and even more preferred more than 10000V. The charged particle beam device (100) is a focusing charged particle beam device, preferably an electron beam microscope, and even more a scanning electron microscope. The charged particle beam device (100) comprises a focusing lens (123), preferably a combined electrostatic magnetic objective lens (123), for focusing the primary charged particle beam. The at least one filter grid electrode (4) comprises an array of openings with a pitch smaller than 100 μm, preferably smaller than 60 μm and even more preferred smaller than 30 μm. The tube voltage (VT) differs by more than 1000V, preferably by more than 4000 V and even more preferred by more than 8000 V from the first voltage (V1).

While the invention has been described with reference to particular embodiments thereof, other embodiments, modifications, and implementations would be appreciated by those of ordinarily skilled in the art without departing from the invention's spirit and scope defined by the claims appended herein.

The invention claimed is:

1. A retarding field analyzer for detecting charged particles, comprising:
    at least one filter grid electrode connectable to a first voltage;
    an entrance grid electrode;
    a charged particle detector positioned to detect the charged particles that have passed through the entrance grid electrode and the filter grid electrode; and
    at least one further electrode element, the at least one further electrode element being one cylindrically shaped jacket, wherein the at least one further electrode element comprises high-ohmic material to provide for a high ohmic resistance between the entrance grid electrode and the at least one filter grid electrode with the high-ohmic material having a resistivity between $10^9$ Ω cm to $10^{11}$ Ω cm;
    wherein the at least one further electrode element is adapted such that the potential on the surface increases or decreases continuously in the direction of the optical axis when a second voltage is applied to the entrance grid electrode.

2. A charged particle beam device to inspect or structure a specimen with a primary charged particle beam, comprising:
    a charged particle beam source to form the primary charged particle beam propagating along an optical axis;
    a retarding field analyzer to detect secondary charged particles generated by the primary charged particle beam on the specimen with the retarding field analyzer including:
        at least one filter grid electrode connectable to a first voltage;
        an entrance grid electrode;
        a charged particle detector positioned to detect the charged particles that have passed through the entrance grid electrode and the filter grid electrode; and
        at least one further electrode element, the at least one further electrode element being one cylindrically shaped jacket, wherein the at least one further electrode element comprises high-ohmic material to provide for a high ohmic resistance between the entrance grid electrode and the at least one filter grid electrode with the high-ohmic material having a resistivity between $10^9$ Ω cm to $10^{11}$ Ω cm;
    wherein the at least one further electrode element is adapted such that the potential on the surface increases or decreases continuously in the direction of the optical axis when a second voltage is applied to the entrance grid electrode.

3. A method of inspecting a specimen by means of a primary charged particle beam generated by a charged particle beam device to inspect or structure a specimen with a primary charged particle beam with the charged particle beam device including:
    a charged particle beam source to form the primary charged particle beam propagating along an optical axis;
    a retarding field analyzer to detect secondary charged particles generated by the primary charged particle beam on the specimen with the retarding field analyzer including:
        at least one filter grid electrode connectable to a first voltage;
        an entrance grid electrode;
        a charged particle detector positioned to detect the charged particles that have passed through the entrance grid electrode and the filter grid electrode;
        at least one further electrode element, the at least one further electrode element being one cylindrically shaped jacket, wherein the at least one further electrode element comprises high-ohmic material to provide for a high ohmic resistance between the entrance grid electrode and the at least one filter grid electrode with the high-ohmic material having a resistivity between $10^9$ Ω cm to $10^{11}$ Ω cm; and
        a beam tube element biasable with a tube voltage to shield the primary charged particle beam from interference by the retarding field analyzer;
    wherein the method comprises:
        providing the specimen for inspection by the primary charged particle beam;
        applying a tube voltage to the beam tube element;

applying a first voltage to the at least one filter grid electrode;

directing the primary charged particle beam onto the specimen to generate secondary charged particles emitted from the specimen;

generating at least one of the at least one third voltages of the at least one further electrode elements for electrically shielding the secondary charged particles from the beam tube element, with the potential of the at least one further electrode element increasing or decreasing continuously in the direction of the optical axis when a second voltage is appleid to the entrance grid electrode;

scanning the primary charged particle beam across a region of the specimen; and detecting the secondary charged particles that have passed through the at least one filter grid electrode as a function of the scanning position by the primary charged particle beam.

4. The method according to claim 3, wherein the first voltage is in the range between 0 V and -50V with respect to the voltage of the specimen.

5. The method according to claim 3, wherein the tube voltage differs by more than 1000 V from the first voltage.

6. The method according to claim 3, wherein the secondary charged particles are passed through a lens used to focus the primary charged particle.

7. The method of claim 5, wherein the tube voltage differs by more than 4000 V from the first voltage.

8. The method of claim 7, wherein the tube voltage differs by more than 8000 V from the first voltage.

9. The method according to claim 3, wherein the at least one further electrode element is connected to a third voltage which is equal to the first voltage or lies between a second voltage, which is applied to the entrance grid electrode, and the first voltage.

10. The retarding field analyzer according to claim 1, wherein the at least one further electrode element is connectable to a third voltage for adjusting the electric field in the retarding electric field region between the entrance grid electrode and the at least one filter grid electrode.

11. The retarding field analyzer according to claim 1, wherein the high-ohmic material is a mixture of ceramics.

12. The retarding field analyzer according to claim 11, wherein the ceramics are based on tin oxide, zirconium oxide, aluminum oxide, aluminum nitride, titanium nitride, or a epoxy resin based material.

13. The retarding field analyzer according to claim 1, wherein the at least one high-ohmic electrode electrically connects the entrance grid electrode with the at least one filter grid electrode.

14. The retarding field analyzer according to claim 1, wherein the at least one high-ohmic electrode surrounds the retarding electric field region completely within a plane normal to the optical axis.

15. The retarding field analyzer according to claim 1, wherein during normal operation, the current flowing through the high-ohmic electrode from the entrance grid electrode to the at least one filter grid electrode is smaller than 1 μA.

16. The retarding field analyzer according to claim 1, wherein the at least one further electrode element is formed of a conducting material.

17. The retarding field analyzer according to claim 16, wherein the conducting material comprises a metal.

18. The retarding field analyzer according to claim 1, wherein the entrance grid electrode is connectable to a second voltage for providing a retarding electric field region between the entrance grid electrode and the at least one filter grid electrode to decelerate the charged particles that have passed through the entrance grid electrode.

19. The retarding field analyzer according to claim 18, wherein the entrance grid electrode and the at least one filter grid electrode are essentially coplanar or essentially concentric to each other.

20. The retarding field analyzer according to claim 1, wherein the at least one further electrode element comprises separate multiple further electrode elements to be connectable to different third voltages.

21. The retarding field analyzer according to claim 20, wherein the multiple further electrode elements are electrically connected with each other to provide for different fourth voltages which decrease along a direction normal to the filter grid electrode to accelerate the secondary charged particles towards the charged particle detector.

22. The retarding field analyzer according to claim 20, wherein the multiple further electrode elements are electrically connected with each other to form a voltage divider to provide for different third voltages which are increased along a direction normal to the filter grid electrode to decelerate secondary charged particles that are generated by the primary charged particle beam on the specimen.

23. The retarding field analyzer according to claim 22, wherein the multiple further electrode elements are electrically connected with each other to provide for different fourth voltages which decrease along a direction normal to the filter grid electrode to accelerate the secondary charged particles towards the charged particle detector.

24. The retarding field analyzer according to claim 1, wherein at least one of the at least one further electrode elements is arranged between the filter grid electrode and the charged particle detector.

25. The retarding field analyzer according to claim 1, wherein the at least one filter grid electrode comprises an array of openings with a pitch smaller than 100 μm and preferably smaller than 60 μm and/or the entrance grid electrode comprises an array of openings with a pitch smaller than 500 μm and preferably smaller than 200 μm.

26. The retarding field analyzer according to claim 1, wherein the at least one filter grid electrode comprises an array of openings with a pitch smaller than 60 μm and/or the entrance grid electrode comprises an array of openings with a pitch smaller than 200 μm.

27. The retarding field analyzer according to claim 1, wherein filter grid electrode and entrance grid electrode are positioned with respect to each other to withstand a voltage difference of more than 2000 V.

28. The retarding field analyzer according to claim 27, wherein filter grid electrode and entrance grid electrode are positioned with respect to each other to withstand a voltage difference of more than 4000 V.

29. The retarding field analyzer according to claim 28, wherein filter grid electrode and entrance grid electrode are positioned with respect to each other to withstand a voltage difference of more than 10000 V.

30. The retarding field analyzer according to claim 1, wherein the at least one further electrode element comprises at least one further inner electrode element having a first radius, and at least one further outer electrode element having a second radius, wherein the second radius is larger than the first radius, wherein the at least one inner further electrode elements and the at least one outer further electrode elements are preferably essentially coaxial.

31. The retarding field analyzer according to claim 1, wherein the entrance grid electrode is a ring-shaped structure having only one opening.

32. The retarding field analyzer according to claim 1 wherein the distance between entrance grid electrode and filter grid electrode is smaller than 100 mm.

33. The retarding field analyzer according to claim 32 wherein the distance between entrance grid electrode and filter grid electrode is smaller than 20 mm.

34. The retarding field analyzer according to claim 33 wherein the distance between entrance grid electrode and filter grid electrode is smaller than 5 mm.

35. The charged particle beam device according to claim 2 comprising a beam tube element biasable with a tube voltage to shield the primary charged particle beam from interference by the retarding field analyzer.

36. The charged particle beam device according to claim 2 wherein the at least one further electrode element is shaped to have an annular, cylindrical or conical shape surrounding the beam tube element.

37. The charged particle beam device according to claim 2, wherein the voltage difference between the first voltage V1 and the tube voltage VT is larger than 1000 V, preferably larger than 4000 V and even more preferred larger than 8000 V.

38. The charged particle beam device according to claim 2, wherein at least one of the following, the entrance grid electrode, the at least one filter grid electrode, the charged particle detector and the at least one further electrode element, are essentially coaxial to the optical axis.

39. The charged particle beam device according to claim 2, wherein the specimen is connectable with a specimen voltage, wherein, during operation, the voltage difference between the specimen voltage and the first voltage is preferably smaller than 100V, preferably smaller than 50V and even more preferred smaller than 10 V.

40. The charged particle beam device according to claim 2, wherein the at least one filter grid electrode, the charged particle detector and at least one further electrode element are enclosed by a further beam tube structure comprising the entrance grid electrode, preferably the beam tube element and preferably at least one further beam tube structure element.

41. The charged particle beam device according to claim 2, wherein the charged particle beam device is an electron beam microscope, and preferably a scanning electron microscope.

42. The charged particle beam device according to claim 2, wherein the charged particle beam device comprises a combined electrostatic magnetic objective lens.

43. The charged particle beam device according to claim 2, wherein the charged particle detector is arranged as an in-lens detector.

* * * * *

UNITED STATES PATENT AND TRADEMARK OFFICE
CERTIFICATE OF CORRECTION

| | | |
|---|---|---|
| PATENT NO. | : 8,203,119 B2 | Page 1 of 1 |
| APPLICATION NO. | : 11/568442 | |
| DATED | : June 19, 2012 | |
| INVENTOR(S) | : Degenhardt et al. | |

It is certified that error appears in the above-identified patent and that said Letters Patent is hereby corrected as shown below:

In Background of the Invention:

Column 2, Line 21, please delete "summount" and insert --surmount-- therefor;

In the Claims:

Column 35, Claim 3, Line 12, please delete "appleid" and insert --applied-- therefor.

Signed and Sealed this
Sixteenth Day of October, 2012

David J. Kappos
*Director of the United States Patent and Trademark Office*